United States Patent
Son et al.

(10) Patent No.: US 11,836,324 B2
(45) Date of Patent: Dec. 5, 2023

(54) ELECTRONIC DEVICE AND DRIVING METHOD THEREOF

(71) Applicant: Samsung Display Co., Ltd., Yongin-si (KR)

(72) Inventors: Hoseok Son, Seoul (KR); Hawon Yu, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 51 days.

(21) Appl. No.: 17/511,552

(22) Filed: Oct. 27, 2021

(65) Prior Publication Data

US 2022/0197440 A1   Jun. 23, 2022

(30) Foreign Application Priority Data

Dec. 17, 2020 (KR) .................. 10-2020-0177780

(51) Int. Cl.
  *G06F 3/044* (2006.01)
  *G06F 3/0354* (2013.01)
  *H10K 59/40* (2023.01)
  *H10K 102/00* (2023.01)

(52) U.S. Cl.
  CPC ........ *G06F 3/0446* (2019.05); *G06F 3/03545* (2013.01); *G06F 2203/04102* (2013.01); *H10K 59/40* (2023.02); *H10K 2102/311* (2023.02)

(58) Field of Classification Search
  CPC ............... G06F 3/0446; G06F 3/03545; G06F 2203/04102; H01L 27/323; H01L 2251/5338
  USPC ........................................................ 345/174
  See application file for complete search history.

(56) References Cited

U.S. PATENT DOCUMENTS

| | | | |
|---|---|---|---|
| 9,798,359 B2 | 10/2017 | Seo et al. | |
| 10,437,358 B2 | 10/2019 | Geaghan et al. | |
| 2007/0218724 A1* | 9/2007 | Tanaka ................. | G06F 1/1658 439/157 |
| 2014/0009435 A1* | 1/2014 | Shih ....................... | G06F 3/046 345/174 |

(Continued)

FOREIGN PATENT DOCUMENTS

| | | | | |
|---|---|---|---|---|
| CN | 107329624 A | * | 11/2017 | .......... G06F 3/0412 |
| KR | 10-2017-0018963 | | 2/2017 | |

(Continued)

OTHER PUBLICATIONS

"A full integration of electromagnetic resonance sensor and capacitive touch sensor into LCD" by Satoshi et al.

*Primary Examiner* — Mark Edwards
(74) *Attorney, Agent, or Firm* — H.C. Park & Associates, PLC

(57) ABSTRACT

An electronic device includes a display layer configured to define a first non-folding area, a second non-folding area, and a folding area between the first non-folding area and the second non-folding area, and display an image, a sensor layer disposed on the display layer to detect an external input, a first digitizer disposed under the display layer and overlapping the first non-folding area, a second digitizer disposed under the display layer and overlapping the second non-folding area, and a main driver configured to calculate coordinates of a pen based on a first signal obtained from the sensor layer, a second signal obtained from the first digitizer, and a third signal obtained from the second digitizer.

20 Claims, 19 Drawing Sheets

(56) References Cited

U.S. PATENT DOCUMENTS

| | | | |
|---|---|---|---|
| 2015/0234498 A1* | 8/2015 | Cho | G06F 3/0446 345/174 |
| 2015/0338888 A1 | 11/2015 | Kim et al. | |
| 2015/0378557 A1 | 12/2015 | Jeong et al. | |
| 2017/0034446 A1* | 2/2017 | Park | G06F 1/1637 |
| 2020/0296291 A1 | 9/2020 | Park et al. | |
| 2020/0348787 A1* | 11/2020 | Wang | G06F 3/0446 |

FOREIGN PATENT DOCUMENTS

| | | |
|---|---|---|
| KR | 10-1713167 | 3/2017 |
| KR | 10-1726306 | 4/2017 |
| KR | 10-2017-0101478 | 9/2017 |
| KR | 10-2019-0068269 | 6/2019 |

\* cited by examiner

ELECTRONIC DEVICE AND DRIVING METHOD THEREOF

CROSS-REFERENCE TO RELATED APPLICATION

This application claims priority from and the benefit of Korean Patent Application No. 10-2020-0177780, filed on Dec. 17, 2020, which is hereby incorporated by reference for all purposes as if fully set forth herein.

BACKGROUND

Field

Embodiments of the invention relate generally to an electronic device and a method of driving the electronic device that may be folded while detecting a touch by a pen.

Discussion of the Background

Multimedia electronic devices such as televisions, mobile phones, tablets, computers, navigation systems, game machines, and the like have electronic devices for displaying images. In addition to the usual input methods such as buttons, keyboard, and mouse, electronic devices may include an input sensor capable of providing a touch-based input method that allows a user to easily and intuitively input information or commands. The input sensor may detect a touch or pressure using a user's body.

There is an increasing demand for use of a pen for detailed touch input for a user who is familiar with inputting information using a writing instrument or for a specific application program (e.g., an application program for sketching or drawing).

The above information disclosed in this Background section is only for understanding of the background of the inventive concepts, and, therefore, it may contain information that does not constitute prior art.

SUMMARY

The inventive concepts provide an electronic device that is foldable and has improved pen utilization, and a driving method thereof.

Additional features of the inventive concepts will be set forth in the description which follows, and in part will be apparent from the description, or may be learned by practice of the inventive concepts.

An embodiment of the inventive concept provides an electronic device including a display layer configured to define a first non-folding area, a second non-folding area, and a folding area between the first non-folding area and the second non-folding area, and display an image; a sensor layer disposed on the display layer to detect an external input; a first digitizer disposed under the display layer and overlapping the first non-folding area; a second digitizer disposed under the display layer and overlapping the second non-folding area; and a main driver configured to calculate coordinates of a pen based on a first signal obtained from the sensor layer, a second signal obtained from the first digitizer, and a third signal obtained from the second digitizer.

In an embodiment, a first detection area overlapping the folding area, a second detection area overlapping the first non-folding area, and a third detection area overlapping the second non-folding area may be defined in the sensor layer, wherein the first signal may be a signal obtained from the first detection area.

In an embodiment, the sensor layer may include a first detection unit disposed in the first detection area, a second detection unit disposed in the second detection area, and a third detection unit disposed in the third detection area, wherein areas of the first to third detection units may be the same.

In an embodiment, the sensor layer may include a first detection unit disposed in the first detection area, a second detection unit disposed in the second detection area, and a third detection unit disposed in the third detection area. An area of the first detection unit may be smaller than each of an area of the second detection unit and an area of the third detection unit.

In an embodiment, the folding area of the display layer may be folded based on a folding axis extending in a first direction. A width of the first detection unit in a direction parallel to the first direction may be the same as a width of each of the second detection unit and the third detection unit in a direction parallel to the first direction. A width of the first detection unit in a direction parallel to the second direction crossing the first direction may be smaller than a width of each of the second detection unit and the third detection unit in a direction parallel to the second direction.

In an embodiment, the electronic device may further include a sensor driver electrically connected to the sensor layer; and a digitizer driver electrically connected to the first digitizer and the second digitizer. The main driver may calculate the coordinates of the pen based on data provided from the sensor driver and data provided from the digitizer driver.

In an embodiment, the first signal may be a signal detected by an input by an object of less than a reference diameter.

In an embodiment, the first digitizer and the second digitizer may be spaced apart from each other. A gap between the first digitizer and the second digitizer may overlap the folding area of the display layer.

In an embodiment, a first detection area configured to detect an input of a pen may be defined in the first digitizer. A second detection area configured to detect an input of the pen may be defined in the second digitizer. A compensation area configured to sense the input of the pen may be defined in the sensor layer. At least a portion of the compensation area may non-overlap each of the first detection area and the second detection area.

In an embodiment, the sensor layer may include a first detection unit disposed in the compensation area, and a second detection unit disposed in a peripheral area of the compensation area. An area of the first detection unit may be smaller than an area of the second detection unit.

In an embodiment, the sensor layer may include an electrode and a cross electrode crossing the electrode. The sensor layer may obtain information on an external input through a change in capacitance between the electrode and the cross electrode. Each of the first digitizer and the second digitizer may include a plurality of coils, and obtain information on an external input through a signal induced to the plurality of coils.

In an embodiment of the inventive concept, an electronic device includes a display layer configured to define a first non-folding area, a second non-folding area, and a folding area between the first non-folding area and the second non-folding area, and display an image; a sensor layer disposed on the display layer to detect an external input and including a plurality of electrodes extending along a first direction and a plurality of cross electrodes extending along a second direction crossing the first direction; a first digitizer disposed under the display layer and overlapping the first non-folding area; and a second digitizer disposed under the display layer and overlapping the second non-folding area. The folding area is folded based on a folding axis extending along the first direction. A first width of a first electrode overlapping the folding area among the plurality of electrodes, the first width being parallel to the second direction, is smaller than a second width of a second electrode spaced apart from the folding area among the plurality of electrodes, the second width being parallel to the second direction.

In an embodiment, the electronic device may further include a main driver configured to calculate coordinates of a pen based on a first signal obtained from the sensor layer, a second signal obtained from the first digitizer, and a third signal obtained from the second digitizer. The first signal may be a signal detected by an input by an object of less than a reference diameter.

In an embodiment, the sensor layer may include a first detection unit overlapping the folding area, a second detection unit overlapping the first non-folding area, and a third detection unit overlapping the second non-folding area. An area of the first detection unit may be smaller than each of areas of the second detection unit and the third detection unit.

In an embodiment, each of the first detection unit, the second detection unit, and the third detection unit may be defined as an area where any one of the plurality of electrodes and any one of the plurality of cross electrodes cross each other.

In an embodiment, a first detection area configured to detect an input of a pen may be defined in the first digitizer. A second detection area configured to detect an input of the pen may be defined in the second digitizer. The first electrode may non-overlap the first detection area and the second detection area. The second electrode may overlap the first detection area or the second detection area.

In an embodiment, the first digitizer and the second digitizer may be spaced apart from each other. A gap between the first digitizer and the second digitizer may overlap the folding area of the display layer.

In an embodiment of the inventive concept, an electronic device driving method includes receiving a first signal from a sensor layer in which a first non-folding area, a second non-folding area, and a folding area between the first and second non-folding areas are defined; receiving a second signal and a third signal from a first digitizer overlapping the first non-folding area and a second digitizer overlapping the second non-folding area, the first and second digitizers being disposed under the sensor layer; and calculating coordinates for a pen input using the first signal, the second signal, and the third signal.

In an embodiment, the first signal may be a signal detected by an input by an object of less than a reference diameter.

In an embodiment, the calculating of the coordinates for the pen input may include calculating coordinates of a pen inputted to the first non-folding area based on a first signal provided from a first detection area of the first digitizer; calculating coordinates of a pen inputted to the second non-folding area based on a second signal provided from a second detection area of the second digitizer; and calculating coordinates of a pen inputted to the folding area based on the first signal provided from a compensation area of the sensor layer non-overlapping the first detection area and the second detection area.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the inventive concepts and are incorporated in and constitute a part of this specification, illustrate embodiments of the inventive concepts and, together with the description serve to explain the inventive concepts. In the drawings.

DETAILED DESCRIPTION

Figure 1A:
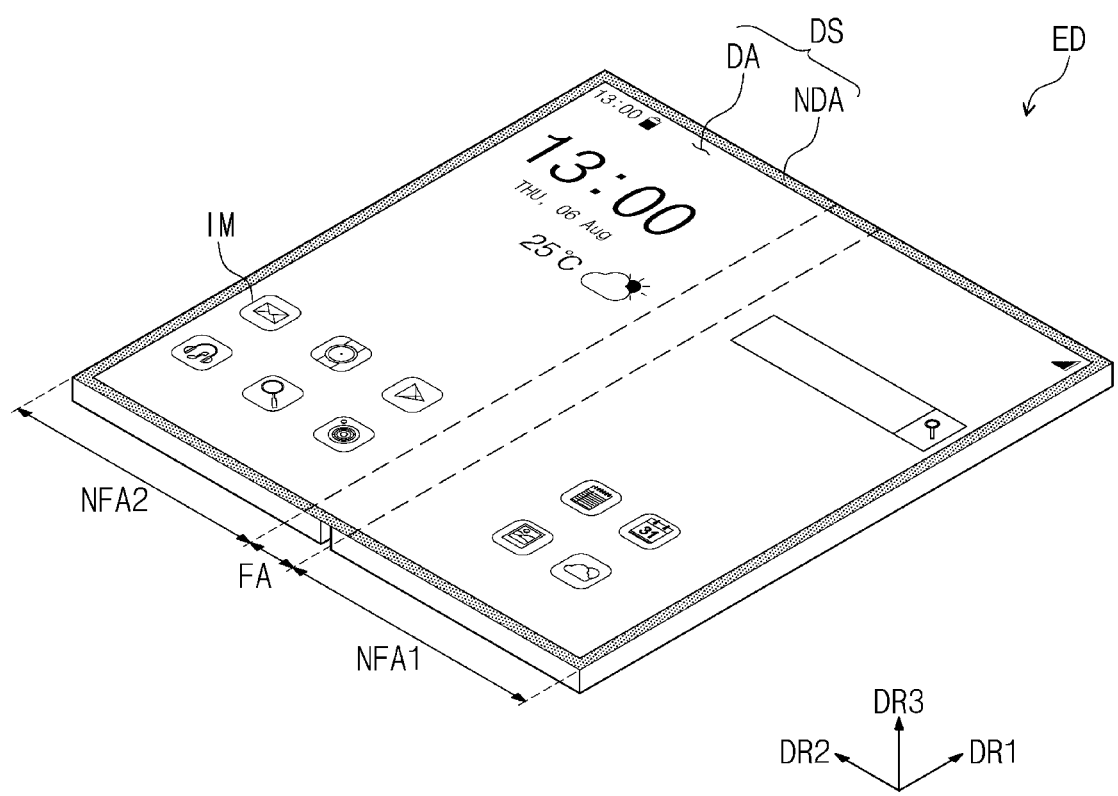
FIGS. 1A and 1B are perspective views illustrating an electronic device according to an embodiment of the inventive concept.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are illustrated in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the inventive concept will be described with reference to the drawings.

Figure 1B:
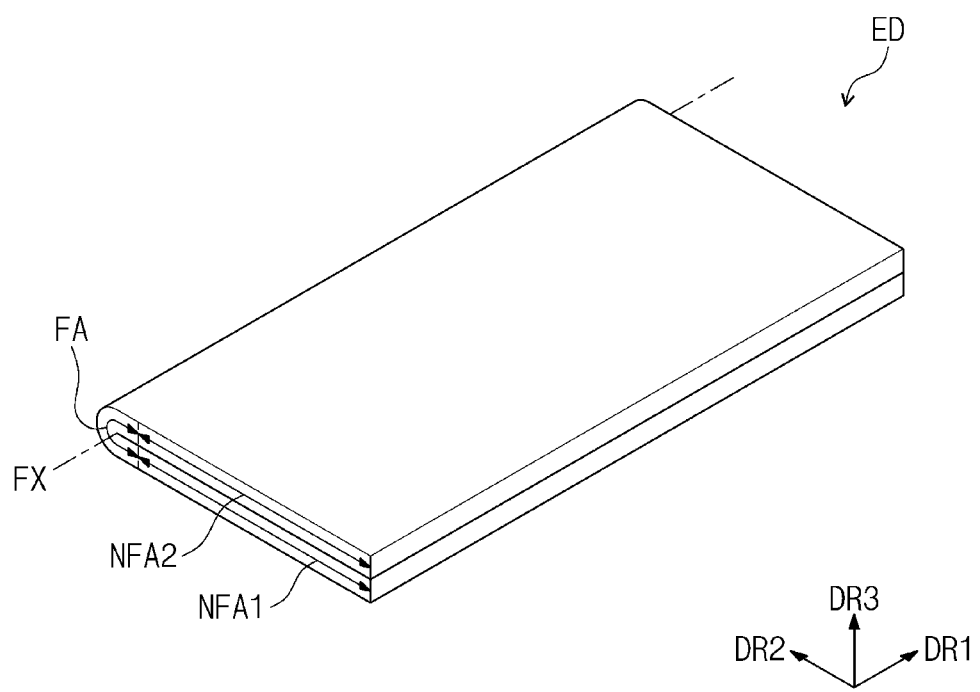

FIGS. 1A and 1B are perspective views illustrating an electronic device ED according to an embodiment of the inventive concept. FIG. 1A illustrates an unfolded state (or an unfolded state) of the electronic device ED, and FIG. 1B illustrates a folded state of the electronic device ED.

Referring to FIGS. 1A and 1B, the electronic device ED according to an embodiment of the inventive concept includes a display surface DS defined by a first direction DR1 and a second direction DR2 crossing the first direction DR1. The electronic device ED may provide the image IM to the user through the display surface DS.

The display surface DS may include a display area DA and a non-display area NDA around the display area DA. The display area DA may display the image IM, and the non-display area NDA may not display the image IM. The non-display area NDA may surround the display area DA. However, the inventive concept is not limited thereto, and the shape of the display area DA and the shape of the non-display area NDA may be modified.

Hereinafter, the direction substantially perpendicular to the plane defined by the first direction DR1 and the second direction DR2 is defined as the third direction DR3. In addition, in the present specification, "on the plane" may be defined as a state viewed from the third direction DR3.

The electronic device ED may include a folding area FA and a plurality of non-folding areas NFA1 and NFA2. The folding area FA may refer to an area of the electronic device ED that may be folded. The non-folding areas NFA1 and NFA2 may refer to areas of the electronic device ED that may not be folded. The non-folding areas NFA1 and NFA2 may include a first non-folding area NFA1 and a second non-folding area NFA2. The folding area FA may be disposed between the first non-folding area NFA1 and the second non-folding area NFA2. The first non-folding area NFA1, the folding area FA, and the second non-folding area NFA2 may be sequentially defined in the electronic device ED along the second direction DR2. The folding area FA may be referred to as a foldable area FA. The first non-folding area NFA1 and the second non-folding area NFA2 may be referred to as a first non-foldable area NFA1 and the second non-foldable area NFA2.

As illustrated in FIG. 1B, the folding area FA may be folded along a folding axis FX parallel to the first direction DR1. The folding area FA may extend along the first direction DR1. The folding area FA may have a predetermined curvature and a radius of curvature. The first non-folding area NFA1 and the second non-folding area NFA2 face each other when folded, and the electronic device ED may be in-folded so that the display surface DS is not exposed to the outside.

In an embodiment of the inventive concept, the electronic device ED may be out-folded so that the display surface DS is exposed to the outside. In an embodiment of the inventive concept, the electronic device ED may be configured such that an in-folding or an out-folding operation is repeated from an unfolding operation to each other, but is not limited thereto. In an embodiment of the inventive concept, the electronic device ED may be configured to select one of an unfolding operation, an in-folding operation, and an out-folding operation.

Figure 2:
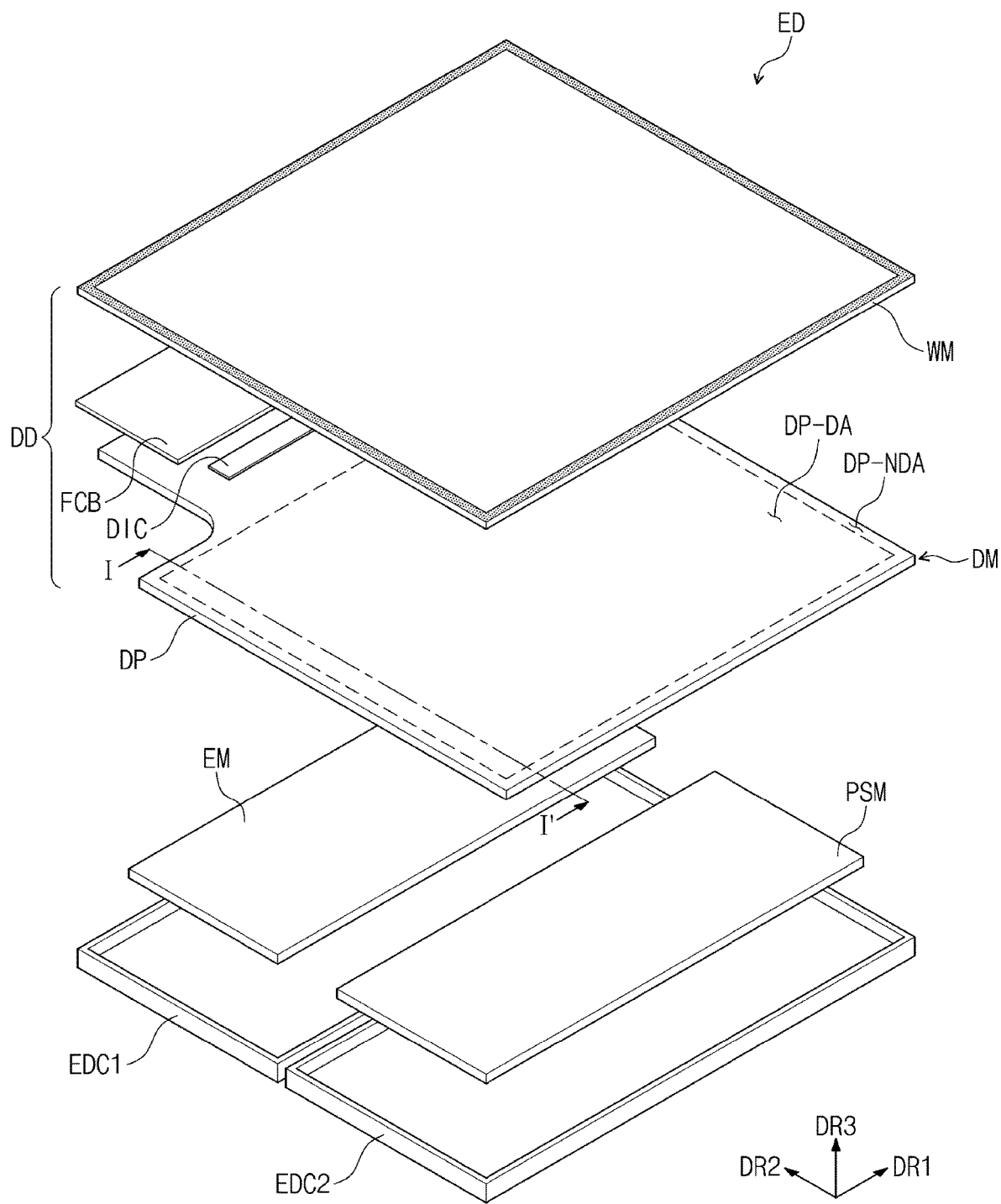
FIG. 2 is an exploded perspective view illustrating an electronic device according to an embodiment of the inventive concept.

FIG. 2 is an exploded perspective view illustrating an electronic device according to an embodiment of the inventive concept.

Referring to FIG. 2, the electronic device ED may include a display device DD, an electronic module EM, a power module PSM, and cases EDC1 and EDC2. Although not illustrated in the drawing, the electronic device ED may further include a mechanical structure configured to control the folding operation of the display device DD.

The display device DD generates an image and detects an external input. The display device DD includes a window module WM and a display module DM. The window module WM provides the front surface of the electronic device ED.

The display module DM may include at least the display panel DP. In FIG. 2, the display module DM is illustrated as being the same as the display panel DP, but the display module DM may be a stacked structure in which a plurality of components are stacked. A detailed description of the stacked structure of the display module DM will be described later.

The display panel DP includes a display area DP-DA and a non-display area DP-NDA corresponding to the display area DA (see FIG. 1A) and the non-display area NDA (see FIG. 1A) of the electronic device ED. In the present specification, "the region/part and the region/part correspond" means overlapping and is not limited to the same area. The display module DM may include a driving chip DIC disposed on the non-display area DP-NDA. The display module DM may further include a flexible circuit film FCB coupled to the non-display area DP-NDA.

The driving chip DIC may include driving elements configured to drive pixels of the display panel DP, for example, a data driving circuit. FIG. 2 illustrates a structure in which the driving chip DIC is mounted on the display panel DP, but the inventive concept is not limited thereto. For example, the driving chip DIC may be mounted on the flexible circuit film FCB.

The electronic module EM includes at least a main driver. The electronic module EM may include a wireless communication module, a camera module, a proximity sensor module, an image input module, an audio input module, an audio output module, a memory, and an external interface module. The electronic module EM is electrically connected to the power module PSM.

The main driver (or main controller) controls the overall operation of the electronic device ED. For example, the main driver activates or deactivates the display device DD according to a user input. The main driver may control the operation of the display device DD and other modules. The main driver may include at least one microprocessor.

The cases EDC1 and EDC2 accommodate the display module DM, the electronic module EM, and the power module PSM. Although two cases EDC1 and EDC2 separated from each other are illustrated as an example, the inventive concept is not limited thereto. Although not illustrated, the electronic device ED may further include a hinge structure configured to connect the two cases EDC1 and EDC2. The cases EDC1 and EDC2 may be combined with the window module WM. The cases EDC1 and EDC2 protect components accommodated in the cases EDC1 and EDC2, such as the display module DM, the electronic module EM, and the power module PSM.

Figure 3A:
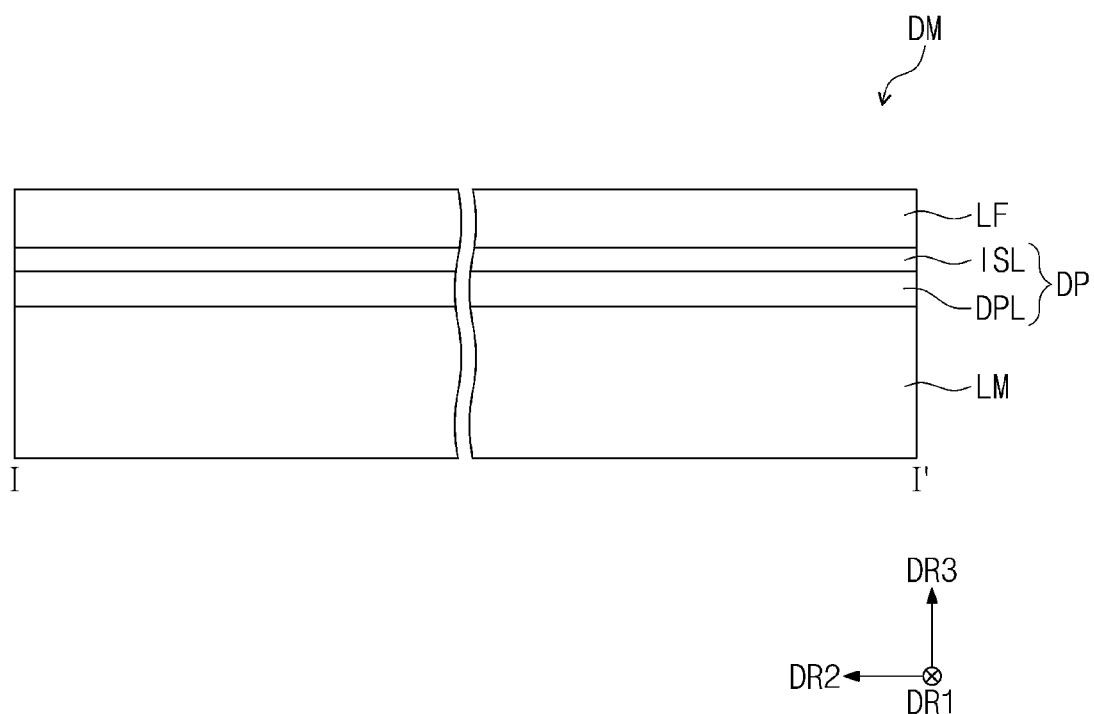
FIG. 3A is a cross-sectional view illustrating a display module according to an embodiment of the inventive concept.

FIG. 3A is a cross-sectional view illustrating a display module according to an embodiment of the inventive concept.

Referring to FIG. 3A, the display module DM may include a display panel DP, an optical film LF disposed on the display panel DP, and a lower member LM disposed under the display panel DP. The display panel DP may include a display layer DPL and a sensor layer ISL disposed on the display layer DPL. An adhesive layer may be disposed between the members as desired.

The display layer DPL may be a component that substantially generates an image. The display layer DPL may be a light emitting display layer, and for example, the display layer DPL may be an organic light emitting display layer, a quantum dot display layer, a micro LED display layer, or a nano LED display layer.

The sensor layer ISL may be disposed on the display layer DPL. The sensor layer ISL may detect an external input applied from the outside. The sensor layer ISL may be an external sensor attached to the display layer DPL, and the sensor layer ISL may be an integrated sensor continuously formed during the manufacturing process of the display layer DPL.

The optical film LF may lower reflectance of light incident from the outside. The optical film LF may include a phase retarder and/or a polarizer. The optical film LF may include at least a polarizing film.

Alternatively, the optical film LF may include color filters. The color filters may have a predetermined arrangement. The arrangement of color filters may be determined in consideration of the emission colors of the pixels PX included in the display layer DPL. In addition, the optical film LF may further include a black matrix adjacent to the color filters.

Alternatively, the optical film LF may include a destructive interference structure. For example, the destructive interference structure may include a first reflective layer and a second reflective layer disposed on different layers. The first reflected light and the second reflected light reflected from the first reflective layer and the second reflective layer, respectively, may be destructively interfered, and thus reflectance of external light is reduced.

The lower member LM may include various functional members. The lower member LM may include a light shielding layer configured to block light incident on the display layer DPL, a shock absorbing layer configured to absorb external shocks, a support layer configured to support the display layer DPL, a heat dissipation layer configured to emit heat generated in the display layer DPL, and a digitizer configured to detect an input of a pen (e.g., an electronic pen). A detailed description of the stacked structure of the lower member LM will be described later.

Figure 3B:
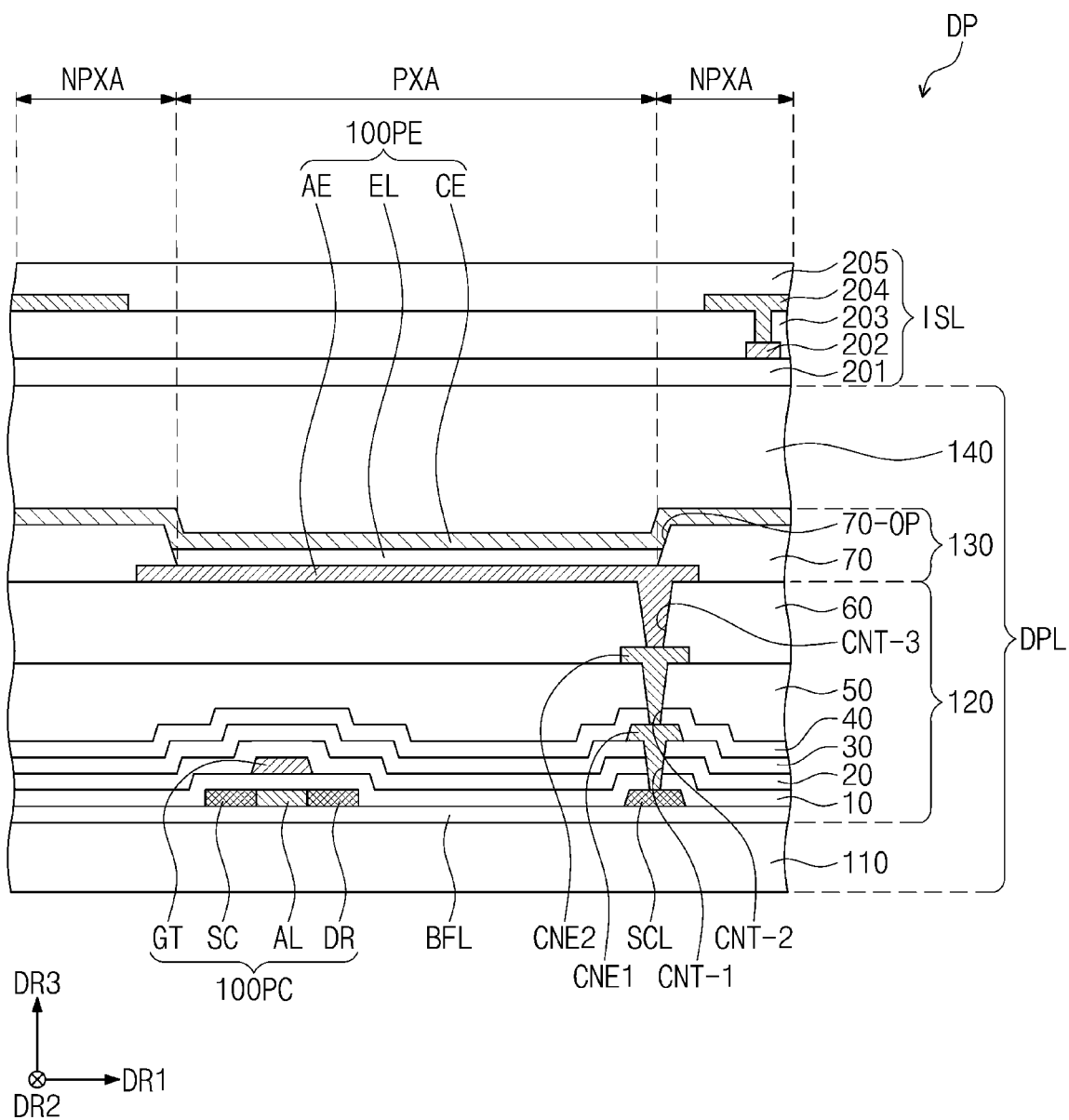
FIG. 3B is a cross-sectional view illustrating a display panel according to an embodiment of the inventive concept.

FIG. 3B is a cross-sectional view illustrating a display panel according to an embodiment of the inventive concept. FIG. 3B is a detailed cross-sectional view of the display panel DP shown in FIG. 3A.

Referring to FIG. 3B, the display layer DPL may include a base layer 110, a circuit layer 120, a light emitting element layer 130, and a sealing layer 140.

The base layer 110 may be a member that provides a base surface on which the circuit layer 120 is disposed. The base layer 110 may be a glass substrate, a metal substrate, or a polymer substrate. However, the embodiment is not limited thereto, and the base layer 110 may be an inorganic layer, an organic layer, or a composite material layer.

The base layer 110 may have a multilayer structure. For example, the base layer 110 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide resin. In addition, each of the first and second synthetic resin layers may include at least one of acrylic resin, methacrylate resin, polyisoprene resin, vinyl resin, epoxy resin, urethane resin, cellulose resin, siloxane resin, polyamide resin, and perylene resin. On the other hand, in the present specification "~~"-based resin means to include a functional group of "~~".

At least one inorganic layer is formed on the upper surface of the base layer 110. The inorganic layer may include at least one of aluminum oxide, titanium oxide, silicon oxide, silicon nitride, silicon oxynitride, zirconium oxide, and hafnium oxide. The inorganic layer may be formed in multiple layers. The multi-layered inorganic layers may constitute a barrier layer and/or a buffer layer. In this embodiment, the display layer DPL is illustrated to include the buffer layer BFL.

The buffer layer BFL may improve bonding force between the base layer 110 and the semiconductor pattern. The buffer layer BFL may include at least one of silicon oxide, silicon nitride, and silicone oxynitride. For example, the buffer layer BFL may have a structure in which a silicon oxide layer and a silicon nitride layer are alternately stacked.

The semiconductor pattern may be disposed on the buffer layer BFL. The semiconductor pattern may include polysilicon. However, the inventive concept is not limited thereto, and the semiconductor pattern may include amorphous silicon, low-temperature polycrystalline silicon, or an oxide semiconductor.

FIG. 3B illustrates only some semiconductor patterns, and semiconductor patterns may be further disposed in other areas. The semiconductor pattern may be arranged in a specific rule across the pixels. Semiconductor patterns may have different electrical properties depending on whether they are doped or not. The semiconductor pattern may include a first area having high conductivity and a second area having low conductivity. The first area may be doped with an N-type dopant or a P-type dopant. The P-type transistor may include a doping area doped with a P-type dopant, and the N-type transistor may include a doping area doped with an N-type dopant. The second area may be a non-doped area or an area doped with a lower concentration than the first area.

The conductivity of the first area is greater than that of the second area, and the fist area may substantially serve as an electrode or a signal line. The second area may substantially correspond to the active (or channel) of the transistor. In other words, a portion of the semiconductor pattern may be an active part of the transistor, another portion may be a source or drain of the transistor, and another portion may be a connection electrode or a connection signal line.

Each of the pixels may have an equivalent circuit including seven transistors, one capacitor, and a light emitting element, and the equivalent circuit diagram of the pixel may be modified in various forms. In FIG. 3B, one transistor 100PC and a light emitting element 100PE included in a pixel are illustrated as an example.

The source SC, the active AL (or active area), and the drain DR of the transistor 100PC may be formed from a semiconductor pattern. The source SC and the drain DR may extend in opposite directions from the active AL on a cross section. FIG. 3B illustrates a part of the connection signal wiring SCL formed from a semiconductor pattern. Although not illustrated in the drawing separately, the connection signal wiring SCL may be connected to the drain DR of the transistor 100PC on a plane.

The first insulating layer 10 may be disposed on the buffer layer BFL. The first insulating layer 10 may overlap a plurality of pixels in common and cover a semiconductor pattern. The first insulating layer 10 may be an inorganic layer and/or an organic layer, and may have a single layer or multilayer structure. The first insulating layer 10 may include at least one of aluminum oxide, titanium oxide, silicon oxide, silicon nitride, silicon oxynitride, zirconium oxide, and hafnium oxide. In this embodiment, the first insulating layer 10 may be a single-layer silicon oxide layer. In addition to the first insulating layer 10, the insulating layer of the circuit layer 120 to be described later may be an inorganic layer and/or an organic layer, and may have a single layer or multilayer structure. The inorganic layer may include at least one of the above-mentioned materials, but is not limited thereto.

The gate GT of the transistor 100PC is disposed on the first insulating layer 10. The gate GT may be a part of the metal pattern. The gate GT overlaps the active AL. In the process of doping the semiconductor pattern, the gate GT may function as a mask.

The second insulating layer 20 is disposed on the first insulating layer 10 and may cover the gate GT. The second insulating layer 20 may overlap the pixels in common. The second insulating layer 20 may be an inorganic layer and/or an organic layer, and may have a single layer or multilayer structure. The second insulating layer 20 may include at least one of silicon oxide, silicon nitride, and silicon oxynitride. In this embodiment, the second insulating layer 20 may have a multilayer structure including a silicon oxide layer and a silicon nitride layer.

The third insulating layer 30 may be disposed on the second insulating layer 20. The third insulating layer 30 may have a single layer or multilayer structure. For example, the third insulating layer 30 may have a multilayer structure including a silicon oxide layer and a silicon nitride layer.

The first connection electrode CNE1 may be disposed on the third insulating layer 30. The first connection electrode CNE1 may be connected to the connection signal wiring SCL through a contact hole CNT-1 penetrating through the first, second, and third insulating layers 10, 20, and 30.

The fourth insulating layer 40 may be disposed on the third insulating layer 30. The fourth insulating layer 40 may be a single layer of silicon oxide. The fifth insulating layer 50 may be disposed on the fourth insulating layer 40. The fifth insulating layer 50 may be an organic layer.

The second connection electrode CNE2 may be disposed on the fifth insulating layer 50. The second connection electrode CNE2 may be connected to the first connection electrode CNE1 through a contact hole CNT-2 penetrating through the fourth insulating layer 40 and the fifth insulating layer 50.

The sixth insulating layer 60 is disposed on the fifth insulating layer 50 and may cover the second connection electrode CNE2. The sixth insulating layer 60 may be an organic layer.

The light emitting element layer 130 may be disposed on the circuit layer 120. The light emitting element layer 130 may include a light emitting element 100PE. For example, the light emitting element layer 130 may include an organic light emitting material, a quantum dot, a quantum rod, a micro LED, or a nano LED. Hereinafter, a description will be given that the light emitting element 100PE is an organic light emitting element, but is not particularly limited thereto.

The light emitting element 100PE may include a first electrode AE, a light emitting layer EL, and a second electrode CE.

The first electrode AE may be disposed on the sixth insulating layer 60. The first electrode AE may be connected to the second connection electrode CNE2 through a contact hole CNT-3 penetrating through the sixth insulating layer 60.

The pixel defining film 70 is disposed on the sixth insulating layer 60 and may cover a portion of the first electrode AE. An opening part 70-OP is defined in the pixel defining film 70. The opening part 70-OP of the pixel defining film 70 exposes at least a portion of the first electrode AE.

The display area DA (refer to FIG. 1A) may include an emission area PXA and a non-emission area NPXA adjacent to the emission area PXA. The non-emission area NPXA may surround the emission area PXA. In this embodiment, the emission area PXA is defined to correspond to a partial area of the first electrode AE exposed by the opening part 70-OP.

The light emitting layer EL may be disposed on the first electrode AE. The light emitting layer EL may be disposed in an area corresponding to the opening part 70-OP. That is, the light emitting layer EL may be formed separately on each of the pixels. When the light emitting layer EL is formed separately on each of the pixels, each of the light emitting layers EL may emit light of at least one color of blue, red, and green. However, the inventive concept is not limited thereto, and the emitting layer EL may be provided in common to the plurality of pixels. In this case, the light emitting layer EL may provide blue light or white light.

The second electrode CE may be disposed on the light emitting layer EL. The second electrode CE has an integral shape and may be commonly disposed on a plurality of pixels.

Although not illustrated in the drawing, a hole control layer may be disposed between the first electrode AE and the light emitting layer EL. The hole control layer may be commonly disposed in the emission area PXA and the non-emission area NPXA. The hole control layer may include a hole transport layer and may further include a hole injection layer. An electron control layer may be disposed between the light emitting layer EL and the second electrode CE. The electron control layer may include an electron transport layer and may further include an electron injection layer. The hole control layer and the electron control layer may be commonly formed in a plurality of pixels using an open mask.

The sealing layer 140 may be disposed on the light emitting element layer 130. The sealing layer 140 may include an inorganic layer, an organic layer, and an inorganic layer sequentially stacked, but the layers constituting the sealing layer 140 are not limited thereto.

The inorganic layer may protect the light emitting element layer 130 from moisture and oxygen, and the organic layer may protect the light emitting element layer 130 from foreign substances such as dust particles. The inorganic layers may include a silicon nitride layer, a silicon oxynitride layer, a silicon oxide layer, a titanium oxide layer, or an aluminum oxide layer. The organic layer may include an acrylic organic layer, but is not limited thereto.

The sensor layer ISL may include a base layer 201, a first conductive layer 202, a detection insulating layer 203, a second conductive layer 204, and a cover insulating layer 205.

The base layer 201 may be an inorganic layer including at least one of silicon nitride, silicon oxynitride, and silicon oxide. Alternatively, the base layer 201 may be an organic layer including an epoxy resin, an acrylic resin, or an imide resin. The base layer 201 may have a single layer structure or may have a multilayer structure stacked along the third direction DR3.

Each of the first conductive layer 202 and the second conductive layer 204 may have a single layer structure or may have a multilayer structure stacked along the third direction DR3.

The single-layered conductive layer may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), indium zinc tin oxide (IZTO), and the like. In addition, the transparent conductive material may include a conductive polymer such as PEDOT, metal nanowires, graphene, and the like.

The multilayered conductive layer may include metal layers. The metal layers may have a three-layer structure of, for example, titanium/aluminum/titanium. The multilayered conductive layer may include at least one metal layer and at least one transparent conductive layer.

At least one of the detection insulating layer 203 and the cover insulating layer 205 may include an inorganic film. The inorganic film may include at least one of aluminum oxide, titanium oxide, silicon oxide, silicon nitride, silicon oxynitride, zirconium oxide, and hafnium oxide.

At least one of the detection insulating layer 203 and the cover insulating layer 205 may include an organic film. The organic film may include at least one of acrylic resin, methacrylic resin, polyisoprene, vinyl resin, epoxy resin, urethane resin, cellulose resin, siloxane resin, polyimide resin, polyamide resin, and perylene resin.

Figure 4:
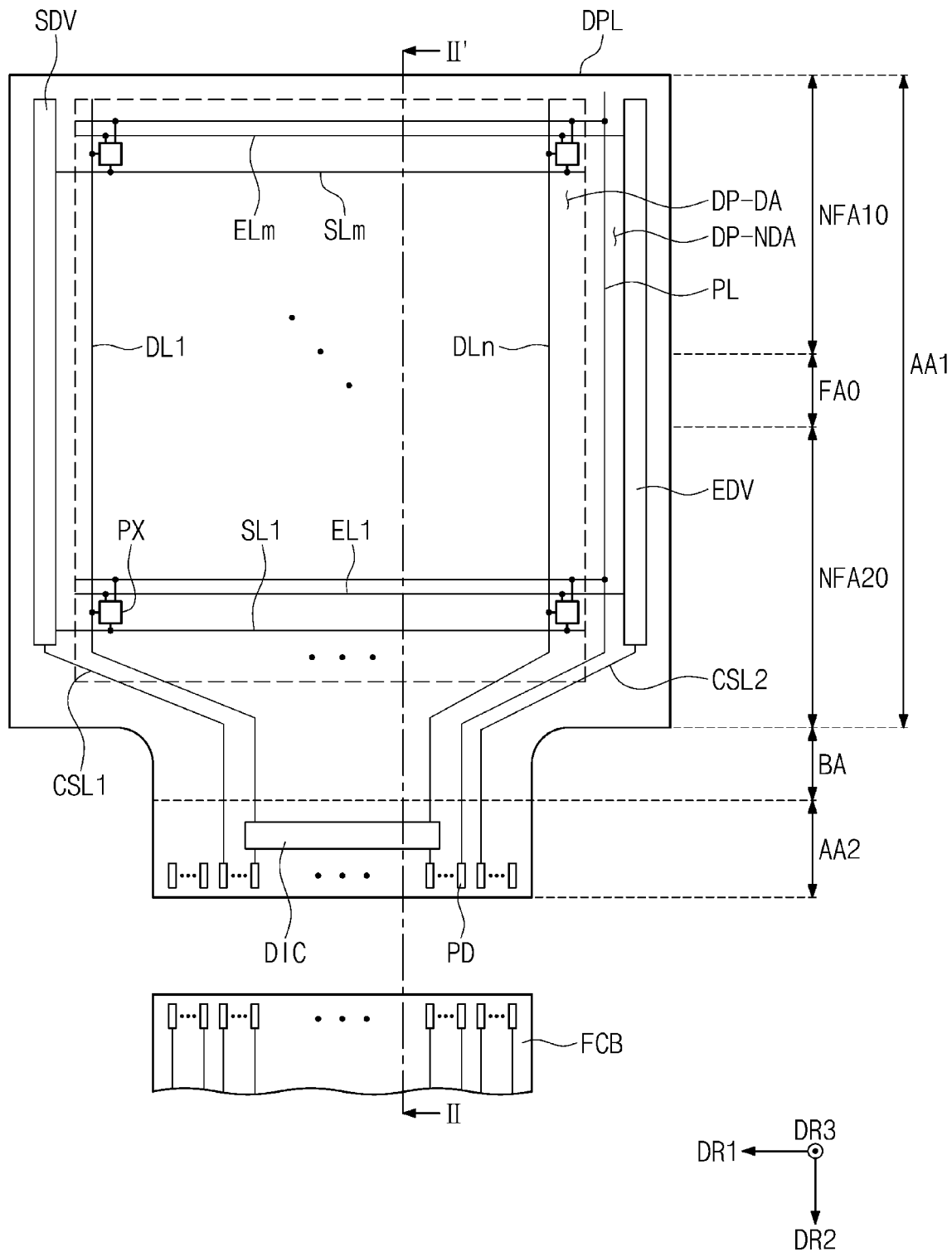
FIG. 4 is a plan view illustrating a display layer according to an embodiment of the inventive concept.

FIG. 4 is a plan view illustrating a display layer according to an embodiment of the inventive concept.

Referring to FIG. 4, a display area DP-DA and a non-display area DP-NDA around the display area DP-DA may be defined in the display layer DPL. The display area DP-DA and the non-display area DP-NDA may be divided by whether or not the pixels PX are disposed. The pixel PX is disposed in the display area DP-DA. A scan driver SDV, a data driver, and an emission driver EDV may be disposed in the non-display area DP-NDA. The data driver may be some circuits configured in the driving chip DIC.

The display layer DPL may include a first panel area AA1, a bending area BA, and a second panel area AA2 defined along the second direction DR2. The second panel area AA2 and a bending area BA may be a partial area of the non-display area DP-NDA. The bending area BA is disposed between the first panel area AA1 and the second panel area AA2.

The first panel area AA1 is an area corresponding to the display surface DS of FIG. 1A. The first panel area AA1 may include a first non-folding area NFA10, a second non-folding area NFA20, and a folding area FA0. The first non-folding area NFA10, the second non-folding area NFA20, and the folding area FA0 correspond to the first non-folding area NFA1, the second non-folding area NFA2, and the folding area FA of FIGS. 1A and 1B, respectively.

The width (or length) of the bending area BA parallel to the first direction DR1 and the width (or length) of the second panel area AA2 may be smaller than the width (or length) of the first panel area AA1 parallel to the first direction DR1. Areas with a short length in the bending axis direction may be bent more easily.

The display layer DPL may include a plurality of pixels PX, a plurality of scan lines SL1 to SLm, a plurality of data lines DL1 to DLn, a plurality of emission lines EL1 to ELm, first and second control lines CSL1 and CSL2, a power line PL, and a plurality of pads PD. Here, m and n are natural numbers. The pixels PX may be disposed in the display area DA and may be connected to the scan lines SL1 to SLm, the data lines DL1 to DLn, and the emission lines EL1 to ELm.

The scan lines SL1 to SLm may extend in the first direction DR1 and may be electrically connected to the scan driver SDV. The data lines DL1-DLn extend in the second direction DR2 and may be electrically connected to the driving chip DIC through the bending area BA. The emission lines EL1-ELm may extend in the first direction DR1 and may be electrically connected to the emission driver EDV.

The power line PL may include a portion extending in the second direction DR2 and a portion extending in the first direction DR1. The portion extending in the first direction DR1 and the portion extending in the second direction DR2 may be disposed on different layers. A portion of the power line PL extending in the second direction DR2 may extend to the second panel area AA2 through the bending area BA. The power line PL may provide a first voltage to the pixels PX.

The first control line CSL1 is connected to the scan driver SDV and may extend toward the lower end of the second panel area AA2 through the bending area BA. The second control line CSL2 is connected to the emission driver EDV and may extend toward the lower end of the second panel area AA2 through the bending area BA.

When viewed in plan view, the pads PD may be disposed adjacent to the lower end of the second panel area AA2. The driving chip DIC, the power line PL, the first control line CSL1, and the second control line CSL2 may be electrically connected to the pads PD. The flexible circuit film FCB may be electrically connected to the pads PD through an anisotropic conductive adhesive layer.

Figure 5:
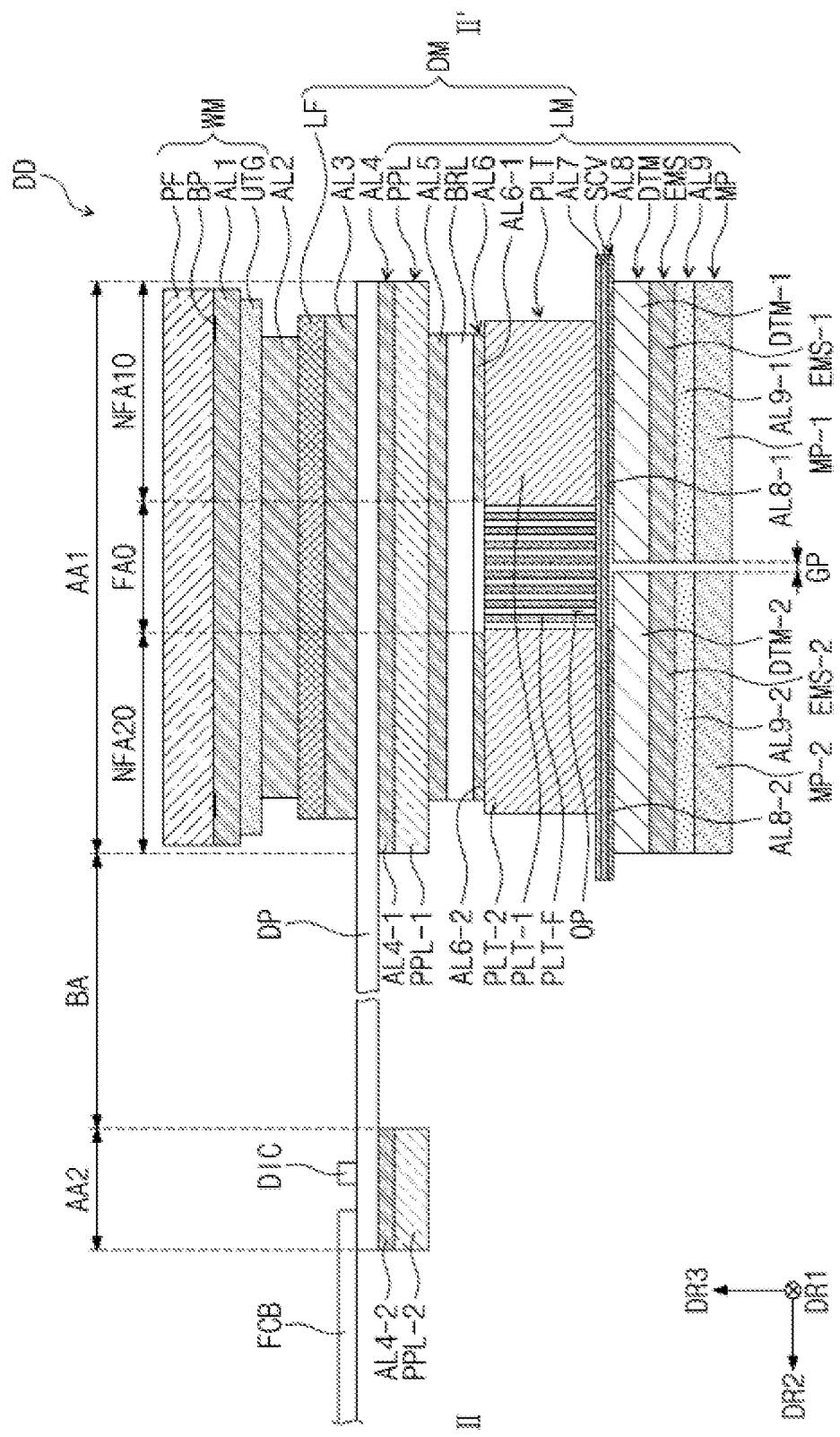
FIG. 5 is a cross-sectional view illustrating a display device according to an embodiment of the inventive concept.
Figure 6:
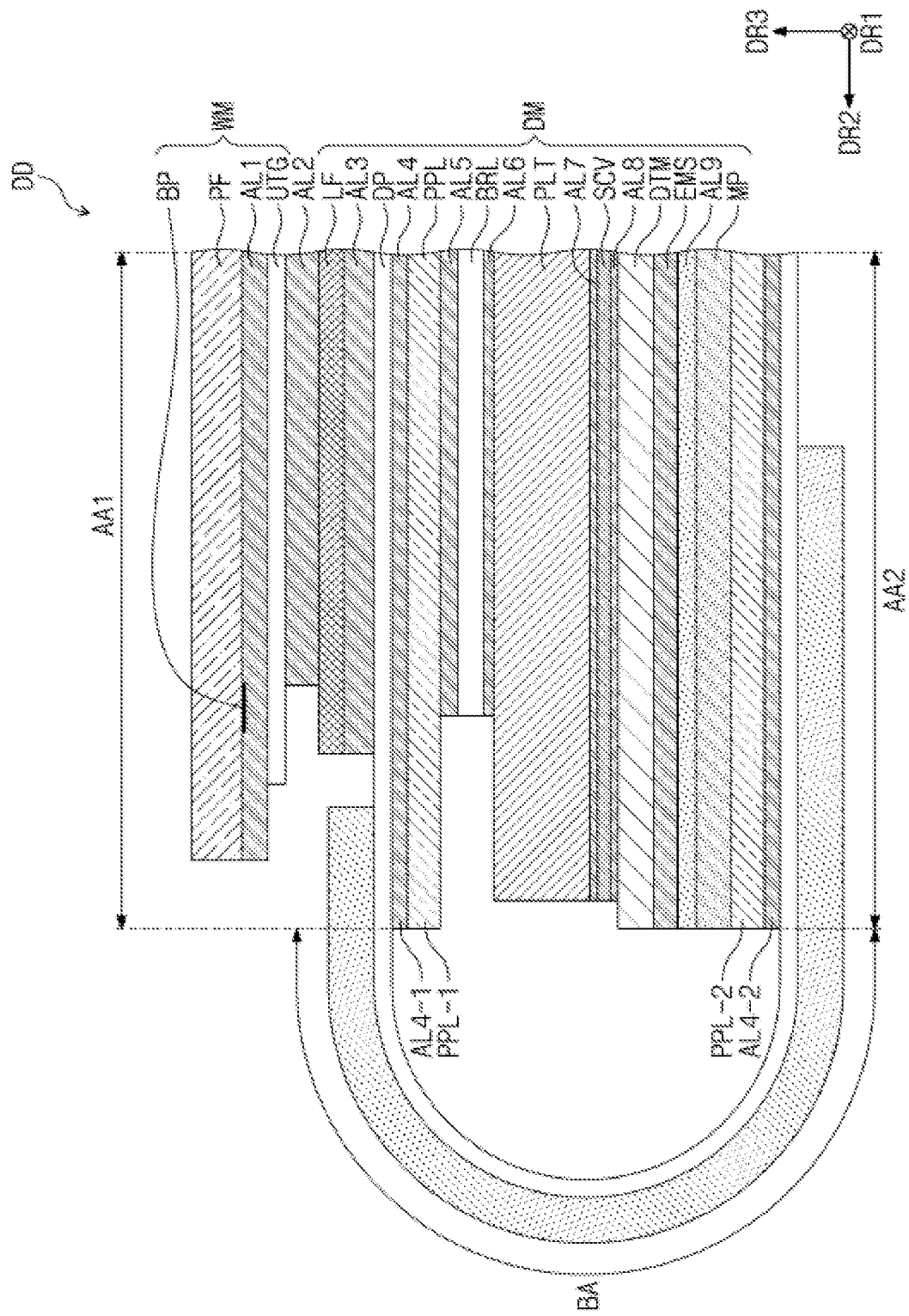
FIG. 6 is a cross-sectional view illustrating a display device according to an embodiment of the inventive concept.

FIG. 5 is a cross-sectional view illustrating a display device according to an embodiment of the inventive concept. FIG. 6 is a cross-sectional view illustrating a display device according to an embodiment of the inventive concept.

FIG. 5 illustrates a state before the display device DD is installed in the electronic device ED (see FIG. 1A), and FIG. 6 illustrates a state in which the display device DD is installed in the electronic device ED (see FIG. 1A). The cross-sectional view of FIG. 5 may include a cross-section taken along line II-II' of FIG. 4.

Referring to FIG. 6, when the display device DD is installed in the electronic device ED (see FIG. 1A), the first panel area AA1 and the second panel area AA2 of the display layer DPL may be disposed on different planes. The second panel area AA2 may be disposed under the first panel area AA1.

Referring to FIGS. 5 and 6, the window module WM may include a thin film glass substrate UTG, a plastic film PF disposed on a thin film glass substrate UTG, a first adhesive layer AL1 bonding the thin film glass substrate UTG and the plastic film PF, and a bezel pattern BP.

The bezel pattern BP overlaps the non-display area NDA illustrated in FIG. 1A. The bezel pattern BP may be disposed on one surface of the thin film glass substrate UTG or one surface of the plastic film PF. FIG. 5 illustrates the bezel pattern BP disposed on the lower surface of the plastic film PF. The inventive concept is not limited thereto, and the bezel pattern BP may be disposed on the upper surface of the plastic film PF, the upper surface of the thin film glass substrate UTG, or the lower surface of the thin film glass substrate UTG. The bezel pattern BP is a colored light shielding film and may be formed by, for example, a coating method. The bezel pattern BP may include a base material and a dye or pigment mixed with the base material. The bezel pattern BP may have a closed line shape on a plane.

The thin film glass substrate UTG may be chemically strengthened glass. As the thin film glass substrate UTG is applied, the occurrence of wrinkles may be minimized even if folding and unfolding are repeated. In an embodiment of the inventive concept, a synthetic resin film may be applied instead of a thin film glass substrate UTG.

The plastic film PF may include polyimide, polycarbonate, polyamide, triacetylcellulose, polymethylmethacrylate, or polyethylene terephthalate. Although not illustrates separately, at least one of a hard coating layer, an anti-fingerprint layer, and an anti-reflection layer may be disposed on the upper surface of the plastic film PF.

The first adhesive layer AL1 may be a pressure sensitive adhesive (PSA) or an optically clear adhesive (OCA). The adhesive layers described below are also the same as the first adhesive layer AL1 and may include a conventional adhesive.

The thickness of the first adhesive layer AU may be 20 μm to 50 μm, for example, 35 μm. The first adhesive layer AL1 may have a thickness sufficient to cover the bezel pattern BP. For example, the thickness of the bezel pattern BP may be 3 μm to 8 μm, and the first adhesive layer AL1 may have a thickness such that no bubbles are generated in the periphery of the bezel pattern BP.

The first adhesive layer AL1 may be separated from the thin glass substrate UTG. Because the strength of the plastic film PF is lower than that of the thin film glass substrate UTG, scratches may occur relatively easily. After separating the first adhesive layer AL1 and the plastic film PF, a new plastic film PF may be attached to the thin film glass substrate UTG.

The window module WM and the display module DM may be coupled by a second adhesive layer AL2. The second adhesive layer AL2 may include a transparent adhesive such as a pressure sensitive adhesive or an optically transparent adhesive.

In a case where the first adhesive layer AL1 and the second adhesive layer AL2 are attached, when the electronic device ED (see FIG. 1A) is folded, because the thin film glass substrate UTG cannot slip, a buckling phenomenon may occur or a crack may occur in the thin film glass substrate UTG. However, according to the embodiment of the inventive concept, because the area of the second adhesive layer AL2 is smaller than the area of the thin film glass substrate UTG, the first adhesive layer AL1 and the second adhesive layer AL2 may not be attached, and a probability of a foreign substance sticking to the second adhesive layer AL2 may be reduced.

The display module DM includes an optical film LF, a display panel DP, a panel protection layer PPL, a barrier layer BRL, a support layer PLT, a cover layer SCV, a digitizer DTM, an electromagnetic shielding layer EMS, a metal plate MP, and the third to ninth adhesive layers AL3 to AL9. The third to ninth adhesive layers AL3 to AL9 may include a transparent adhesive such as a pressure sensitive adhesive or an optically transparent adhesive. In an embodiment of the inventive concept, some of the above-described configurations may be omitted or other configurations may be further added. In addition, the stacking order illustrated in FIG. 5 is only an exemplary order, and the stacking order of each component may be changed.

The optical film LF is disposed in the first panel area AA1. The optical film LF covers at least the display area DP-DA (see FIG. 2). The second adhesive layer AL2 is bonded to the optical film LF and the window module WM, and the third adhesive layer AL3 is bonded to the optical film LF and the display panel DP.

The panel protection layer PPL may be disposed under the display panel DP. The panel protection layer PPL may protect the lower portion of the display panel DP. The panel protection layer PPL may include a flexible plastic material. The panel protection layer PPL may prevent scratches from being generated on the rear surface of the display panel DP during the manufacturing process of the display panel DP. The panel protection layer PPL may be a colored polyimide film. For example, the panel protection layer PPL may be an opaque yellow film, but is not limited thereto. The display panel DP of FIG. 5 may include the sensor layer ISL (see FIG. 3A) and the display layer DPL (see FIG. 3A).

In an embodiment of the inventive concept, the panel protection layer PPL may be non-arranged in the bending area BA. The panel protection layer PPL may include a first panel protection layer PPL-1 protecting the first panel area AA1 of the display panel DP, and a second panel protection layer PPL-2 protecting the second panel area AA2. When the bending area BA is bent, the second panel protection layer PPL-2 may be disposed under the first panel area AA1 and the first panel protection layer PPL-1 together with the second panel area AA2 of the display panel DP. Because the panel protection layer PPL is not disposed in the bending area BA, the bending area BA may be more easily bent.

The fourth adhesive layer AL4 may couple the panel protection layer PPL and the display panel DP. The fourth adhesive layer AL4 may include a first portion AL4-1 corresponding to the first panel protection layer PPL-1 and a second portion AL4-2 corresponding to the second panel protection layer PPL-2. The first portion AL4-1 may couple the first panel protection layer PPL-1 to the first panel area AA1 of the display panel DP, and the second portion AL4-2 may couple the second panel protection layer PPL-2 to the second panel area AA2 of the display panel DP.

The barrier layer BRL may be disposed under the panel protection layer PPL. The fifth adhesive layer AL5 is disposed between the panel protection layer PPL and the barrier layer BRL to couple the barrier layer BRL to the panel protection layer PPL.

The barrier layer BRL may increase resistance to a compressive force due to external pressing. Accordingly, the barrier layer BRL may prevent deformation of the display panel DP. The barrier layer BRL may include a flexible plastic material such as polyimide or polyethylene terephthalate.

In addition, the barrier layer BRL may absorb light incident from the outside. The barrier layer BRL may include a light shielding material or may be a colored film having a low light transmittance. For example, the barrier layer BRL may be a black plastic film, for example, a black polyimide film. When the display module DM is viewed from the upper side of the window module WM, components disposed under the barrier layer BRL may not be visually recognized by the user.

The support layer PLT is disposed under the barrier layer BRL. The support layer PLT supports components disposed above the support layer PLT, and maintains the unfolded and folded state of the display device DD. The support layer PLT includes a first support portion PLT-1 corresponding to the first non-folding area NFA10 and having insulating properties, and a second support portion PLT-2 corresponding to the second non-folding area NFA20 and having insulating properties. The first support portion PLT-1 and the second support portion PLT-2 are spaced apart from each other in the second direction DR2.

The support layer PLT may further include a folding portion PLT-F that corresponds to the folding area FA0, is disposed between the first support portion PLT-1 and the second support portion PLT-2, and has a plurality of defined openings OP.

The first support portion PLT-1 and the second support portion PLT-2 may include a non-metallic material, plastic, glass fiber reinforced plastic, or glass. The plastic may include polyimide, polyethylene, or polyethylene terephthalate, and is not particularly limited. The first support portion PLT-1 and the second support portion PLT-2 may include the same material.

The folding portion PLT-F may include the same material as the first support portion PLT-1 and the second support portion PLT-2, or may include different materials. For example, the folding portion PLT-F may include a material having an elastic modulus of 60 GPa or more, and may include a metal material such as stainless steel. For example, the folding portion PLT-F may include SUS 304, but is not limited thereto, and the folding portion PLT-F may include various metal materials.

The area of the barrier layer BRL may be smaller than the area of the support layer PLT. The areas may be areas on a plane. On the plane, the barrier layer BRL may overlap a part of the support layer PLT. Another part of the support layer PLT may non-overlap the barrier layer BRL.

The sixth adhesive layer AL6 may be disposed between the barrier layer BRL and the support layer PLT. The sixth adhesive layer AL6 may couple the barrier layer BRL and the support layer PLT to each other. The sixth adhesive layer AL6 may include a first portion AL6-1 and a second portion AL6-2 spaced apart from each other.

The first portion AL6-1 and the second portion AL6-2 may be spaced apart from each other with a plurality of openings OP interposed therebetween. On a plane, the sixth adhesive layer AL6 may non-overlap the plurality of openings OP. In addition, on a plane, the sixth adhesive layer AL6 may be spaced apart from the plurality of openings OP.

The first portion AL6-1 may overlap the first non-folding area NFA10, the second portion AL6-2 may overlap the second non-folding area NFA20, and the first portion AL6-1 and the second portion AL6-2 may non-overlap the folding area FA0. Flexibility of the display device DD may be improved by not disposing the sixth adhesive layer AL6 in the area corresponding to the folding area FA0.

When the electronic device ED (see FIG. 1A) is folded, because an empty space is defined between the barrier layer BRL and the support layer PLT, the shapes of the plurality of openings OP defined in the support layer PLT may not be visually recognized from the outside of the electronic device ED (refer to FIG. 1A).

In addition, as the barrier layer BRL includes a light shielding material or is a colored film having a low light transmittance, a difference in color sense of the support layer PLT may not be visually recognized from the outside. For example, in the support layer PLT, a color difference between the first support area in which the plurality of openings OP is defined and the second support area in which the plurality of openings OP is not defined may not be recognized from the outside. The first support area may be an area overlapping with the folding area FA0, and the second support area may be an area overlapping with the first non-folding area NFA10 and the second non-folding area NFA20.

The thickness of the sixth adhesive layer AL6 may be smaller than the thickness of the fifth adhesive layer AL5. For example, the thickness of the fifth adhesive layer AL5 may be 25 μm, and the thickness of the sixth adhesive layer AL6 may be 16 μm.

As the thickness of the sixth adhesive layer AL6 is thinner, the step difference due to the sixth adhesive layer AL6 may be reduced. As the step difference becomes smaller, there is an advantage of reducing shape deformation of stacked structures due to folding and unfolding of the electronic device ED (see FIG. 1A), but the plurality of openings OP may be visually recognized, or the sixth adhesive layer AL6 may be removed by a repeated folding operation. As the thickness of the sixth adhesive layer AL6 increases, the plurality of openings OP may not be visible, and the reliability of the adhesion of the sixth adhesive layer AL6 increases due to the repeated folding operation, but the step difference may increase. Accordingly, the thickness of the sixth adhesive layer AL6 may be selected within an appropriate range in consideration of folding reliability, adhesion reliability, and visibility of the plurality of openings OP.

The seventh adhesive layer AL7 may be disposed under the support layer PLT, and the cover layer SCV may be disposed under the seventh adhesive layer AL7. The support layer PLT and the cover layer SCV may be combined by the seventh adhesive layer AL7. The cover layer SCV may be manufactured in the form of a sheet and may be attached to the support layer PLT.

The seventh adhesive layer AL7 and the cover layer SCV may cover a plurality of openings OP defined in the support layer PLT. Accordingly, the cover layer SCV may prevent foreign substances from flowing into the plurality of openings OP. The cover layer SCV may have a lower modulus of elasticity than the support layer PLT. For example, the cover layer SCV may include thermoplastic polyurethane, rubber, or silicone, but is not limited thereto.

The eight adhesive layer AL8 may be disposed under the cover layer SCV. The eighth adhesive layer AL8 may include a first portion AL8-1 and a second portion AL8-2. The first portion AL8-1 and the second portion AL8-2 may be spaced apart from each other. On a plane, the first portion AL8-1 and the second portion AL8-2 may be spaced apart by interposing a plurality of openings OP. The first portion AL8-1 and the second portion AL8-2 may non-overlap with the folding area FA0.

The digitizer DTM may be disposed under the eighth adhesive layer AL8. The digitizer DTM may include a plurality of loop coils that generate a magnetic field having a preset resonance frequency with the electronic pen. The digitizer DTM may also be referred to as an EMR detection panel.

The digitizer DTM may include a first digitizer DTM-1 attached to the first portion AL8-1 of the eighth adhesive layer AL8, and a second digitizer DTM-2 attached to the second portion AL8-2 of the eighth adhesive layer AL8. The first digitizer DTM-1 and the second digitizer DTM-2 are disposed to be spaced apart from each other with a predetermined gap GP. The gap GP may be 0.3 mm to 3 mm, and may be disposed to correspond to the folding area FA0.

Figure 7:
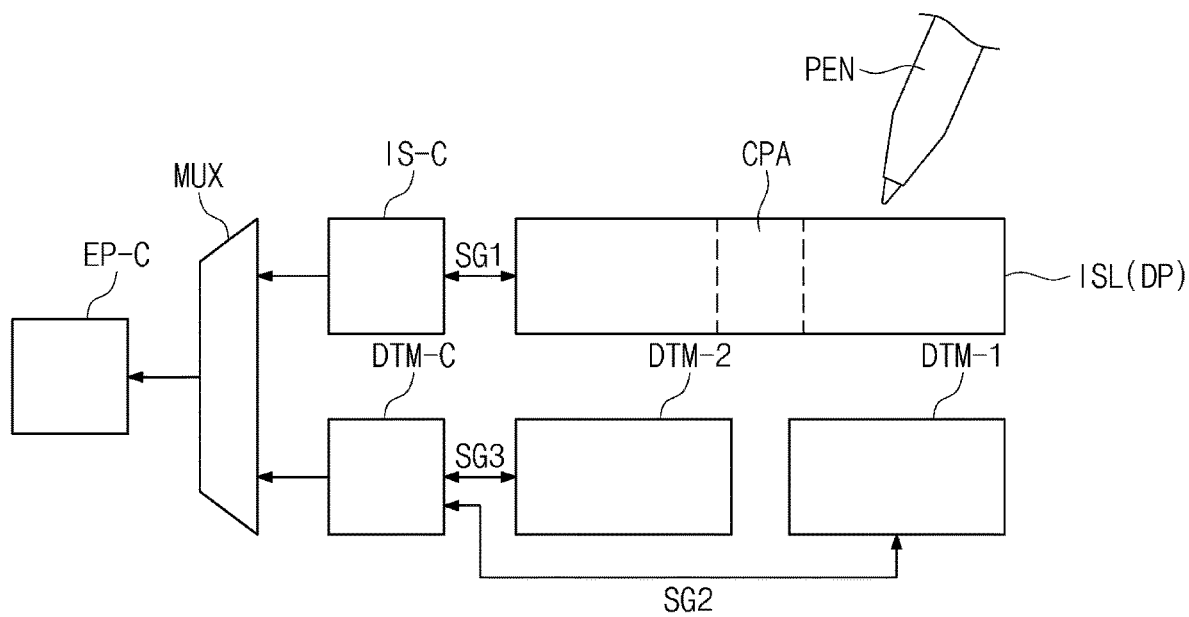
FIG. 7 is a diagram illustrating an operation of an electronic device according to an embodiment of the inventive concept.

The magnetic field formed by the first digitizer DTM-1 and the second digitizer DTM-2 is applied to an LC resonance circuit composed of an inductor (coil) and a capacitor of a pen PEN (see FIG. 7). The coil generates current by the received magnetic field and transfers the generated current to the capacitor. Accordingly, the capacitor charges the current inputted from the coil and discharges the charged current into the coil. Eventually, a magnetic field of a resonant frequency is emitted to the coil. The magnetic field emitted by the pen PEN (see FIG. 7) may be absorbed again by the loop coil of the digitizer, and accordingly, it is possible to determine which positions of the first digitizer DTM-1 and the second digitizer DTM-2 are close to the pen PEN (see to FIG. 7).

The electromagnetic shielding layer EMS may be disposed under the digitizer DTM. The electromagnetic shielding layer EMS may be added to block electromagnetic waves generated from the electronic module EM (see FIG. 2) from affecting the digitizer DTM as noise. The electromagnetic shielding layer EMS may include a first electromagnetic shielding layer EMS-1 and a second electromagnetic shielding layer EMS-2 respectively corresponding to the first digitizer DTM-1 and the second digitizer DTM-2. In this embodiment, the electromagnetic shielding layer EMS may include a magnetic metal powder layer. The magnetic metal powder layer may be directly formed on the lower surface of the digitizer DTM through coating and curing processes. In an embodiment of the inventive concept, the electromagnetic shielding layer EMS may be omitted.

The electromagnetic shielding layer EMS and the metal plate MP may be combined by the ninth adhesive layer AL9. The ninth adhesive layer AL9 may include a first portion AL9-1 and a second portion AL9-2 spaced apart from each other. The metal plate MP may include a first metal plate MP-1 and a second metal plate MP-2 attached to the first portion AL9-1 and the second portion AL9-2, respectively. The metal plate MP improves heat dissipation, and when fixing the second panel protection layer PPL-2 after bending as illustrated in FIG. 6, the components of the upper side of the metal plate MP may be protected from external pressure generated in the attachment process. In FIG. 6, the adhesive layer between the metal plate MP and the second panel protection layer PPL-2 is not illustrated.

Figure 8:
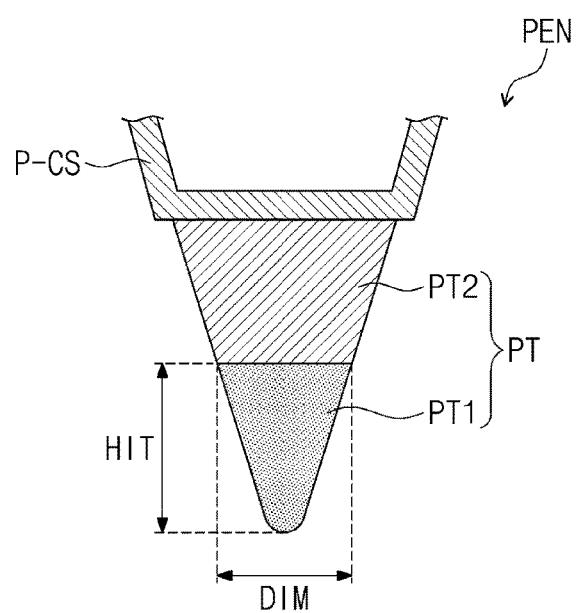
FIG. 8 is a cross-sectional view illustrating a pen according to an embodiment of the inventive concept.

FIG. 7 is a diagram illustrating an operation of an electronic device according to an embodiment of the inventive concept. FIG. 8 is a cross-sectional view illustrating a pen according to an embodiment of the inventive concept.

Referring to FIG. 7, a partial configuration of the electronic device ED (see FIG. 1A) is illustrated. The electronic device ED (see FIG. 1A) may include a sensor layer ISL, a first digitizer DTM-1, a second digitizer DTM-2, a sensor driver IS-C, a digitizer driver DTM-C, and a main driver EP-C. The sensor layer ISL is a part of the display panel DP. The digitizer DTM is positioned in the lower member LM of the display module DM.

The sensor layer ISL may be a capacitive touch type touch sensor that detects an external input by detecting a change in mutual capacitance. The first digitizer DTM-1 and the second digitizer DTM-2 may be EMR type touch sensors that are configured to detect an external input through signals induced to coils.

The sensor driver IS-C may be electrically connected to the sensor layer ISL. The digitizer driver DTM-C may be electrically connected to each of the first digitizer DTM-1 and the second digitizer DTM-2 in a parallel configuration, but embodiments are not limited thereto. The first digitizer DTM-1 and the second digitizer DTM-2 may be connected in series and configured to transmit signals transferred from both digitizer elements. The main driver EP-C may calculate the coordinates of the pen PEN based on data provided from the sensor driver IS-C and data provided from the digitizer driver DTM-C.

The first digitizer DTM-1 and the second digitizer DTM-2 may be spaced apart from each other in areas overlapping the folding area FA0 (refer to FIG. 5). In this case, when the electronic device ED (refer to FIG. 1A) is folded and deformed, the shapes of each of the first digitizer DTM-1 and the second digitizer DTM-2 may not be deformed. That is, damage to the first digitizer DTM-1 and the second digitizer DTM-2 due to folding stress may be prevented or removed, and thus reliability of the electronic device ED (refer to FIG. 1A) may be improved. In addition, because each of the first digitizer DTM-1 and the second digitizer DTM-2 may not need to secure flexibility, design freedom of the first digitizer DTM-1 and the second digitizer DTM-2 may be improved.

When an external input by the pen PEN is provided, the first digitizer DTM-1 and the second digitizer DTM-2 may generate signals based on pen coordinate calculation. In this case, an input by the pen PEN may not be detected in an area where the first digitizer DTM-1 and the second digitizer DTM-2 are not disposed. According to an embodiment of the inventive concept, an input by the pen PEN may be detected using the sensor layer ISL in the area where the first digitizer DTM-1 and the second digitizer DTM-2 are not disposed. For example, a compensation area CPA may be defined in the sensor layer ISL. The compensation area CPA may be an area overlapping the gap GP (refer to FIG. 5) between the first digitizer DTM-1 and the second digitizer DTM-2. The width of the compensation area CPA may correspond to the gap GP (refer to FIG. 5), but may have a larger width than the gap GP (refer to FIG. 5).

The main driver EP-C may calculate the coordinates of the pen PEN based on the first signal SG1 obtained from the sensor layer ISL, the second signal SG2 obtained from the first digitizer DTM-1, and the third signal SG3 obtained from the second digitizer DTM-2. For example, the main driver EP-C may display a pen image corresponding to an input of the pen PEN on the electronic device ED (refer to FIG. 1A) based on the first signal SG1, the second signal SG2, and the third signal SG3. Alternatively, the main driver EP-C may compensate for the second signal SG2 and the third signal SG3 based on the first signal SG1 and display a pen image corresponding thereto the electronic device ED (see FIG. 1A).

According to an embodiment of the inventive concept, because the first digitizer DTM-1 and the second digitizer DTM-2 are spaced apart from each other in an area overlapping the folding area FA0 (see FIG. 5), folding reliability of the electronic device ED (see FIG. 1A) may be improved. In addition, by using the sensor layer ISL, the first and second digitizers DTM-1 and DTM-2 in combination with the sensor layer ISL may detect the input of the pen PEN to the area where the input by the pen PEN cannot be detected by the first and second digitizers DTM-1 and DTM-2. Accordingly, because the entire display area DA (refer to FIG. 1A) may be used as a pen input available area, the electronic device ED (refer to FIG. 1A) with improved pen utilization may be provided.

The main driver EP-C may exchange data with each of the sensor driver IS-C and the digitizer driver DTM-C through serial peripheral interface (SPI) communication. The sensor driver IS-C and the main driver EP-C may be connected to each other through a multiplexer MUX, and the digitizer driver DTM-C and the main driver EP-C may be connected to each other through the multiplexer MUX.

The main driver EP-C may control the overall operation of the electronic device ED (refer to FIG. 1A). For example, the main driver EP-C may control operations of the sensor driver IS-C and the digitizer driver DTM-C. In addition, the main driver EP-C may control the operation of the driving chip DIC (see FIG. 4) that controls the display layer DPL (see FIG. 4). The main driver EP-C may include at least one microprocessor, and the main driver EP-C may be referred to as a central processing unit.

Referring to FIGS. 7 and 8, the pen PEN may include a housing P-CS and a pen tip PT. The pen tip PT may include a first portion PT1 and a second portion PT2. The first portion PT1 may include an insulating material, and the second portion PT2 may include a conductive material. For example, the first portion PT1 may include rubber, and the second portion PT2 may include metal. The housing P-CS may be made of metal, and the second portion PT2 of the pen tip PT may be in contact with the housing P-CS. For example, when a user holds the pen PEN and provides an input to the electronic device ED (see FIG. 1A), a change may occur in the mutual capacitance defined in the sensor layer ISL by the second portion PT2, the housing P-CS, and a user. That is, in addition to the first and second digitizers DTM-1 and DTM-2, the sensor layer ISL may detect an input by using the pen PEN.

According to an embodiment of the inventive concept, the height HIT (or thickness) of the first portion PT1 and the minimum diameter DIM of the second portion PT2 may be designed such that the sensor layer ISL may detect an input by the second portion PT2. For example, the height HIT of the first portion PT1 may be 1 mm, but is not particularly limited thereto. The minimum diameter DIM of the second portion PT2 may be defined as the diameter of the second portion PT2 in contact with the first portion PT1. When viewed in plan view, the surface of the second portion PT2 in contact with the first portion PT1 may be a circle. The coordinates of the pen PEN obtained by the sensor layer ISL may be an object having a reference diameter or less, for example, coordinates detected by an input by the second portion PT2. That is, the first signal SG1 may be a signal detected by an input by an object having a reference diameter or less.

The minimum diameter DIM of the second portion PT2 may be 3 mm, but is not particularly limited thereto. For example, the minimum diameter DIM of the second portion PT2 may be designed to be greater than or equal to the minimum diameter detectable in the sensor layer ISL and less than the reference diameter. The reference diameter may be a diameter that serves as a reference to classify an input by a user's body and an input by a pen PEN. For example, the reference diameter may be 5 mm to 10 mm. For example, assuming that the reference diameter is 5 mm, if the diameter of the object is less than 5 mm, the sensor driver IS-C may recognizes the diameter as pen coordinates and if the diameter of the object exceeds 5 mm, recognize the diameter as an input by the user's body.

Figure 9A:
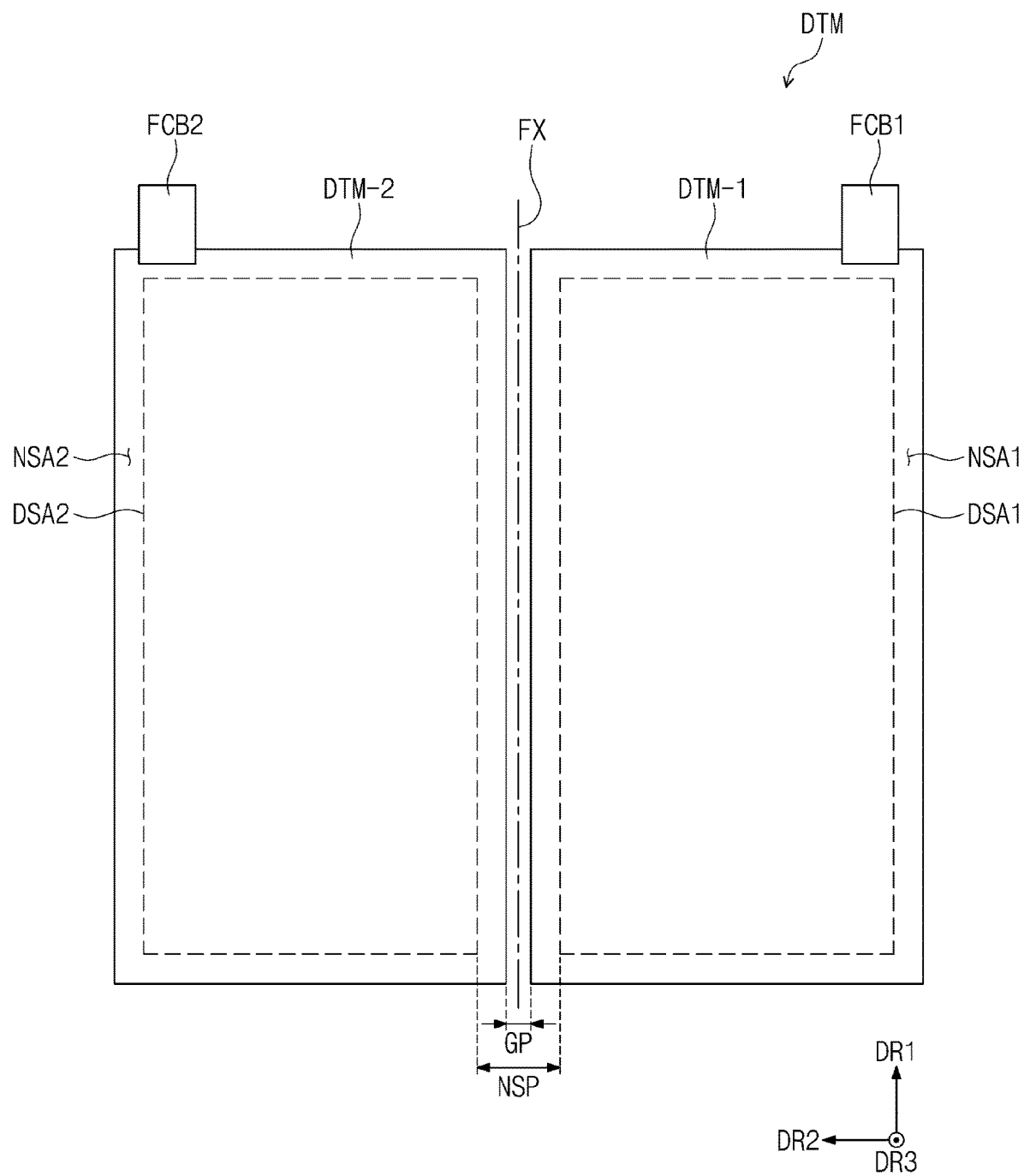
FIG. 9A is a plan view illustrating a digitizer according to an embodiment of the inventive concept.
Figure 9B:
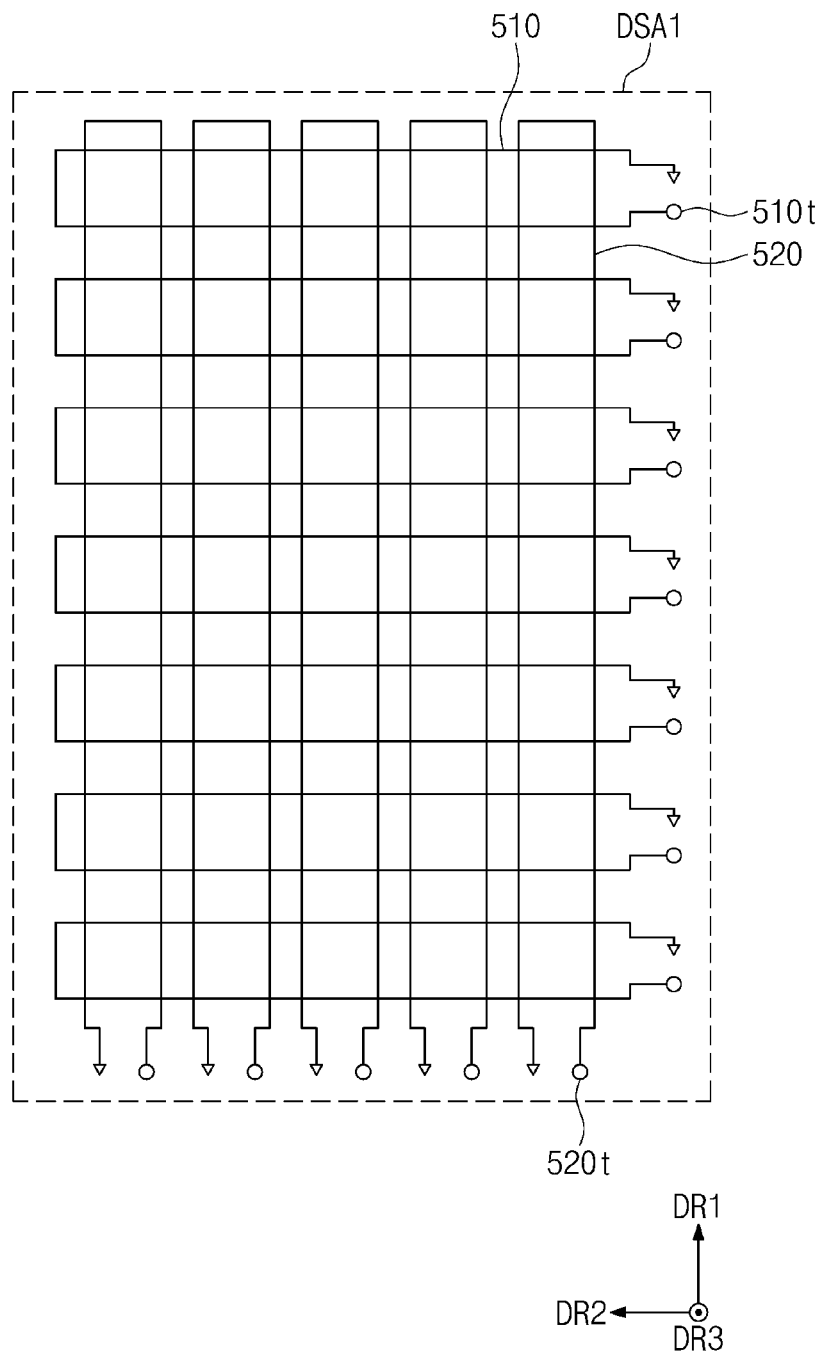
FIG. 9B is a plan view illustrating a detection area of a digitizer according to an embodiment of the inventive concept.

FIG. 9A is a plan view illustrating a digitizer according to an embodiment of the inventive concept. FIG. 9B is a plan view illustrating a detection area of a digitizer according to an embodiment of the inventive concept.

Referring to FIGS. 9A and 9B, the digitizer DTM may include a first digitizer DTM-1 and a second digitizer DTM-2 spaced apart from each other. For example, the first digitizer DTM-1 and the second digitizer DTM-2 may be spaced apart from each other with the folding axis FX interposed therebetween.

The first flexible circuit film FCB1 and the second flexible circuit film FCB2 may be electrically connected to the first digitizer DTM-1 and the second digitizer DTM-2, respectively. The first flexible circuit film FCB1 and the second flexible circuit film FCB2 may be connected to the same circuit board. Each of the first flexible circuit film FCB1 and the second flexible circuit film FCB2 may be connected to the main circuit board to which the flexible circuit film FCB described in FIG. 5 is connected. The first flexible circuit film FCB1 and the second flexible circuit film FCB2 may be replaced with one circuit film.

The first digitizer DTM-1 and the second digitizer DTM-2 may include a first detection area DSA1 and a second detection area DSA2, respectively, and include a first non-detection area NSA1 and a second non-detection area NSA2, respectively. The first non-detection area NSA1 and the second non-detection area NSA2 are disposed adjacent to the first detection area DSA1 and the second detection area DSA2, respectively. Because the configurations of the first digitizer DTM-1 and the second digitizer DTM-2 are substantially the same, the description will be made with reference to the first digitizer DTM-1.

Referring to FIGS. 9A and 9B, the first digitizer DTM-1 may include a plurality of first loop coils 510 (hereinafter referred to as first coils) and a plurality of second loop coils 520 (hereinafter referred to as second coils). The first coils 510 may be referred to as driving coils, and the second coils 520 may be referred to as detection coils, but are not limited thereto and vice versa. The first coils 510 and the second coils 520 may be disposed in the first detection area DSA1.

The first coils 510 are arranged along a first direction DR1, and each of the first coils 510 extends along a second direction DR2. Each of the second coils 520 may extend along the first direction DR1, and the second coils 520 may be arranged to be spaced apart from each other in the second direction DR2. Unlike illustrated in FIG. 9B, the first coils 510 may be arranged so that adjacent coils overlap each other. A bridge pattern may be disposed in the crossing area of the first coils 510. The second coils 520 may be arranged so that adjacent coils overlap each other. A bridge pattern may be disposed in the crossing area of the second coils 520.

An AC signal may be sequentially provided to the first terminals 510t of the first coils 510. Other terminals of the first coils 510 may be grounded. Signal lines may be respectively connected to the first terminals 510t of the first coils 510, but are not illustrated in FIG. 9B. These signal lines may be disposed in the non-detection area NSA1 illustrated in FIG. 9A.

When a current flows through the first coils 510, a line of magnetic force may be induced between the first coils 510 and the second coils 520. The second coils 520 may detect the induced electromagnetic force emitted from the pen PEN (refer to FIG. 7) and output the detection signal to the second terminals 520t of the second coils 520. Other terminals of second coils 520 may be grounded. Signal lines may be respectively connected to the second terminals 520t of the second coils 520, but are not illustrated in FIG. 9B. These signal lines may be disposed in the first non-detection area NSA1 illustrated in FIG. 9A.

The compensation area CPA illustrated in FIG. 7 may correspond to the gap GP, but the compensation area CPA may have a larger width than the gap GP. For example, the compensation area CPA may be defined to cover all of the areas NSP between the first detection area DSA1 and the second detection area DSA2. Accordingly, the input of the pen PEN to the area where the input by the pen PEN (see FIG. 7) cannot be detected by the first and second digitizers DTM-1 and DTM-2 is compensated by the compensation area CPA (see FIG. 7).

Figure 10:
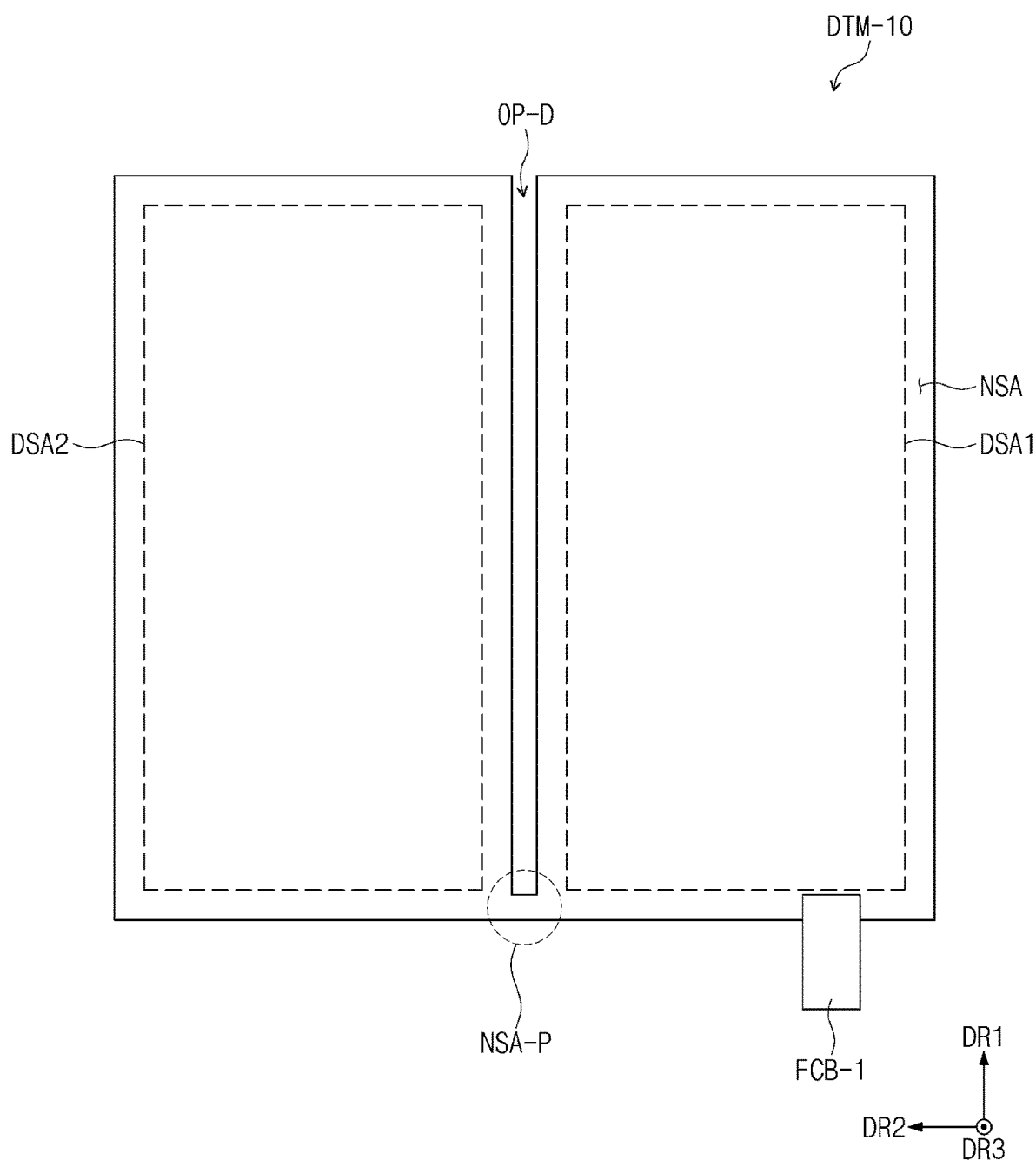
FIG. 10 is a plan view illustrating a digitizer according to an embodiment of the inventive concept.

FIG. 10 is a plan view illustrating a digitizer according to an embodiment of the inventive concept.

Referring to FIG. 10, the digitizer DTM10 may include a first detection area DSA1, a second detection area DSA2, and a non-detection area NSA. An opening part OP-D may be defined between the non-detection area NSA adjacent to the first detection area DSA1 and the non-detection area NSA adjacent to the second detection area DSA2. As illustrated in FIG. 1B, because the opening part OP-D is arranged in the area corresponding to the folding area FA of the electronic device ED, when the electronic device ED is folded, a stress generated in the digitizer DTM10 may be reduced.

The opening part OP-D is not formed within the non-detection area NSA, and an area connecting the non-detection area NSA adjacent to the first detection area DSA1 and the non-detection area NSA adjacent to the second detection area DSA2 may be defined as a passage area NSA-P. Signal lines connected to the loop coils disposed in the second detection area DSA2 may pass through the passage area NSA-P. The ends of these signal lines may be aligned with the bonding area of the flexible circuit film FCB-1. Ends of signal lines connected to the loop coils disposed in the first detection area DSA1 may also be aligned with the bonding area. Accordingly, the first detection area DSA1 and the second detection area DSA2 may be activated with one flexible circuit film FCB-1.

Figure 11A:
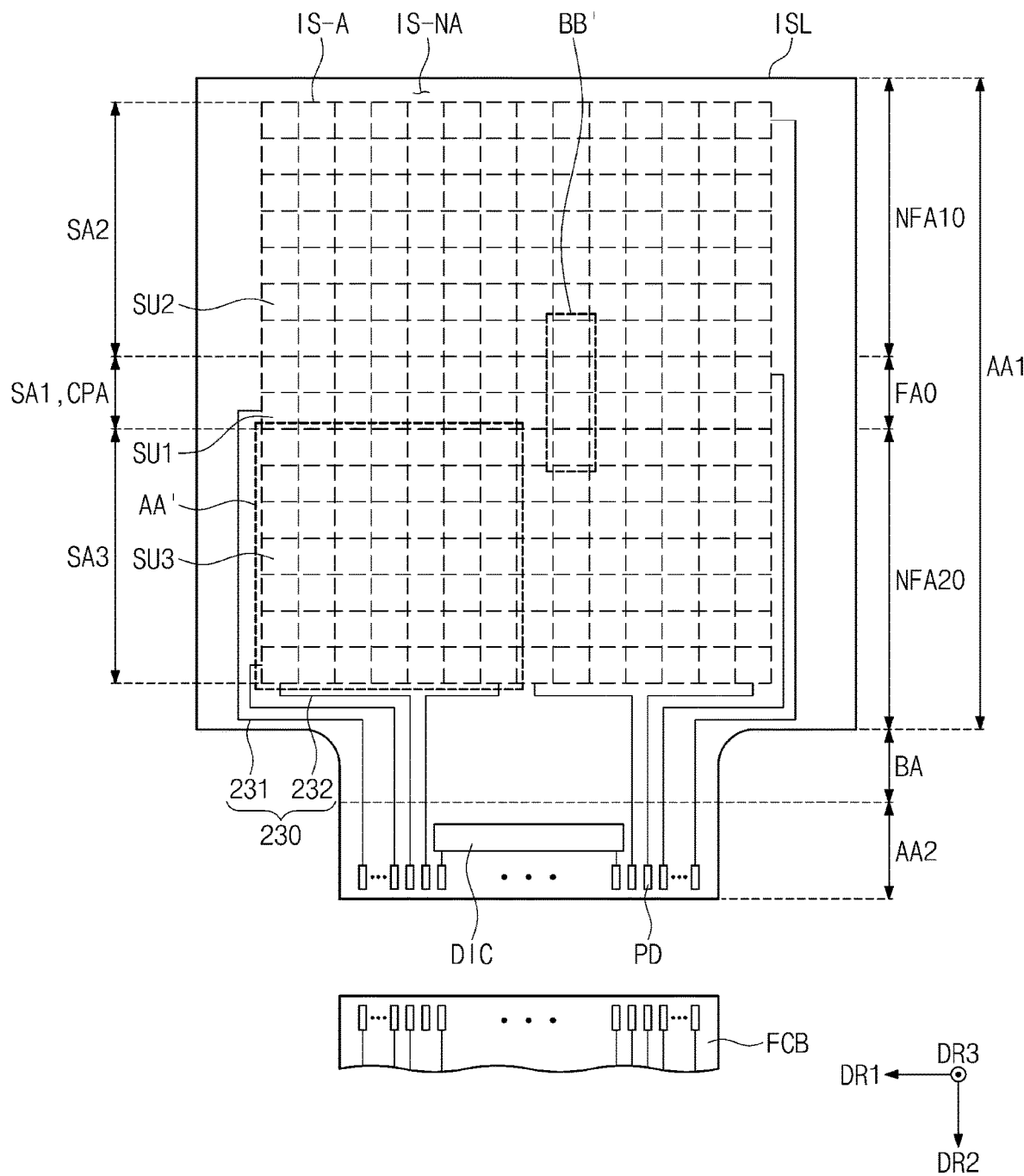
FIG. 11A is a plan view illustrating a sensor layer according to an embodiment of the inventive concept.
Figure 11B:
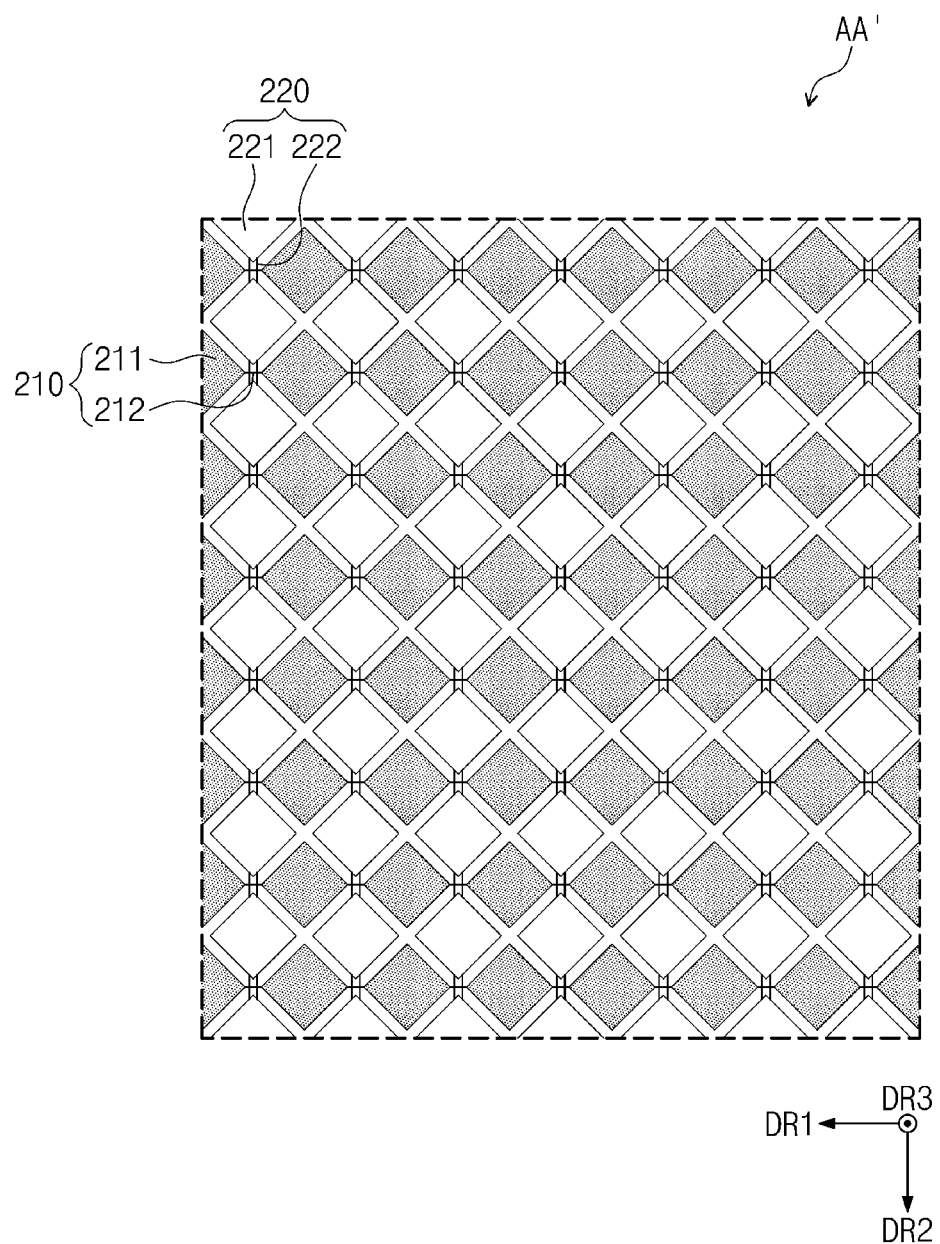
FIG. 11B is an enlarged plan view of an area AA' shown in FIG. 11A.
Figure 12:
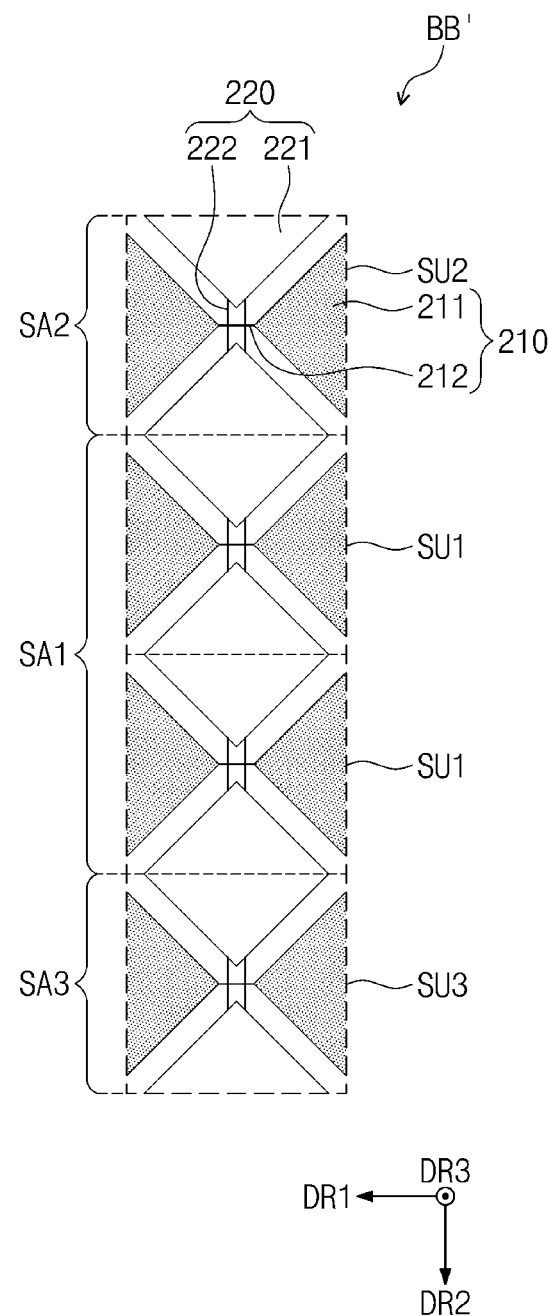
FIG. 12 is an enlarged plan view of an area BB' shown in FIG. 11A.

FIG. 11A is a plan view illustrating a sensor layer according to an embodiment of the inventive concept. FIG. 11B is an enlarged plan view of an area AA' shown in FIG. 11A. FIG. 12 is an enlarged plan view of an area BB' shown in FIG. 11A.

Referring to FIGS. 11A, 11B, and 12, a detection area IS-A and a peripheral area IS-NA may be defined in the sensor layer ISL. The detection area IS-A may be an area activated according to an electrical signal. For example, the detection area IS-A may be an area configured to detect an external input. The peripheral area IS-NA is adjacent to the detection area IS-A and may surround the detection area IS-A.

The sensor layer ISL may include electrodes 210, cross electrodes 220, and detection lines 230. The electrodes 210 and the cross electrodes 220 may be disposed in the detection area IS-A, and the detection lines 230 may be disposed in the peripheral area IS-NA. The sensor layer ISL may obtain information on an external input through a change in mutual capacitance between the electrodes 210 and the cross electrodes 220.

Each of the electrodes 210 may extend along the first direction DR1, and the electrodes 210 may be arranged along the second direction DR2. The electrodes 210 may include first portions 211 and second portions 212. The second portion 212 may be adjacent to two first portions 211 adjacent to each other.

The cross electrodes 220 may be arranged along the first direction DR1, and each of the cross electrodes 220 may extend along the second direction DR2. The cross electrodes 220 may include patterns 221 and connection patterns 222 (or bridge patterns). The connection patterns 222 may electrically connect two adjacent patterns 221 to each other. The two patterns 221 adjacent to each other may be connected to each other by the two connection patterns 222, but the inventive concept is not limited thereto. The second portion 212 may insulatively cross the two connection patterns 222.

The patterns 221, the first portions 211, and the second portions 212 may be disposed on the same layer as each other, and the connection patterns 222 may be disposed on a layer different from the patterns 221, the first portions 211, and the second portions 212. For example, the patterns 221, the first portions 211, and the second portions 212 may be included in the second conductive layer 204 (see FIG. 3B), and the connection patterns 222 may be included in the first conductive layer 202 (see FIG. 3B), and this structure may be referred to as a bottom bridge structure. However, the inventive concept is not particularly limited thereto. For example, the patterns 221, the first portions 211, and the second portions 212 may be included in the first conductive layer 202 (see FIG. 3B), and the connection patterns 222 may be included in the second conductive layer 204 (see FIG. 3B), and this structure may be referred to as a top bridge structure.

The shape and arrangement relationship of the electrodes 210 and the cross electrodes 220 illustrated in FIG. 11B is only illustrated as an example, and the shape and arrangement of the electrodes 210 and the cross electrodes 220 constituting the sensor layer ISL are not limited to those illustrated in FIG. 11B.

The detection lines 230 may be electrically connected to corresponding pads PD among the pads PD, respectively. The detection lines 230 may include lines 231 and crossing lines 232.

The lines 231 may be electrically connected to the electrodes 210, respectively. Some of the lines 231 may be connected to the left side of some of the electrodes 210, and another part of the lines 231 may be connected to the right of another part of the electrodes 210, respectively. The crossing lines 232 may be electrically connected to the cross electrodes 220, respectively. However, the connection relationship between the lines 231 and the electrodes 210 and the connection relationship between the crossing lines 232 and the cross electrodes 220 are not limited to the example illustrated in FIG. 11A.

A first detection area SA1, a second detection area SA2, and a third detection area SA3 may be defined in the sensor layer ISL. The first to third detection areas SA1, SA2, and SA3 may correspond to the detection area IS-A. The first detection area SA1 may overlap the folding area FA0, the second detection area SA2 may overlap the first non-folding area NFA10, and the third detection area SA3 may overlap the second non-folding area NFA20. The first detection area SA1 may correspond to the compensation area CPA.

The sensor layer ISL may include a first detection unit SU1 disposed in the first detection area SA1, a second detection unit SU2 disposed in the second detection area SA2, and a third detection unit SU3 disposed in the third detection area SA3. Each of the first to third detection units SU1, SU2, and SU3 may be defined as an area where one of the electrodes 210 and one of the cross electrodes 220 cross each other. Areas of the first to third detection units SU1, SU2, and SU3 may be the same.

At least a portion of the first detection area SA1 may non-overlap the first detection area DSA1 (see FIG. 9A) of the first digitizer DTM-1 (see FIG. 9A) and the second detection area DSA2 (see FIG. 9A) of the second digitizer DTM-2 (see FIG. 9A). The first detection area SA1 may correspond to the compensation area CPA described above.

According to an embodiment of the inventive concept, the part where the input by the pen PEN (see FIG. 7) is not detected by the first digitizer DTM-1 (see FIG. 9A) and the second digitizer DTM-2 (see FIG. 9A) in the display area DA (see FIG. 1A) of the electronic device ED (see FIG. 1A) may be detected by the sensor layer ISL. Accordingly, because the entire display area DA (refer to FIG. 1A) may be used as a pen input available area, the electronic device ED (refer to FIG. 1A) with improved pen utilization may be provided. According to an embodiment of the inventive concept, as the first digitizer DTM-1 and the second digitizer DTM-2 are spaced apart from each other in an area overlapping the folding area FA0 (see FIG. 5), folding reliability of the electronic device ED (see FIG. 1A) may be improved.

Figure 13:
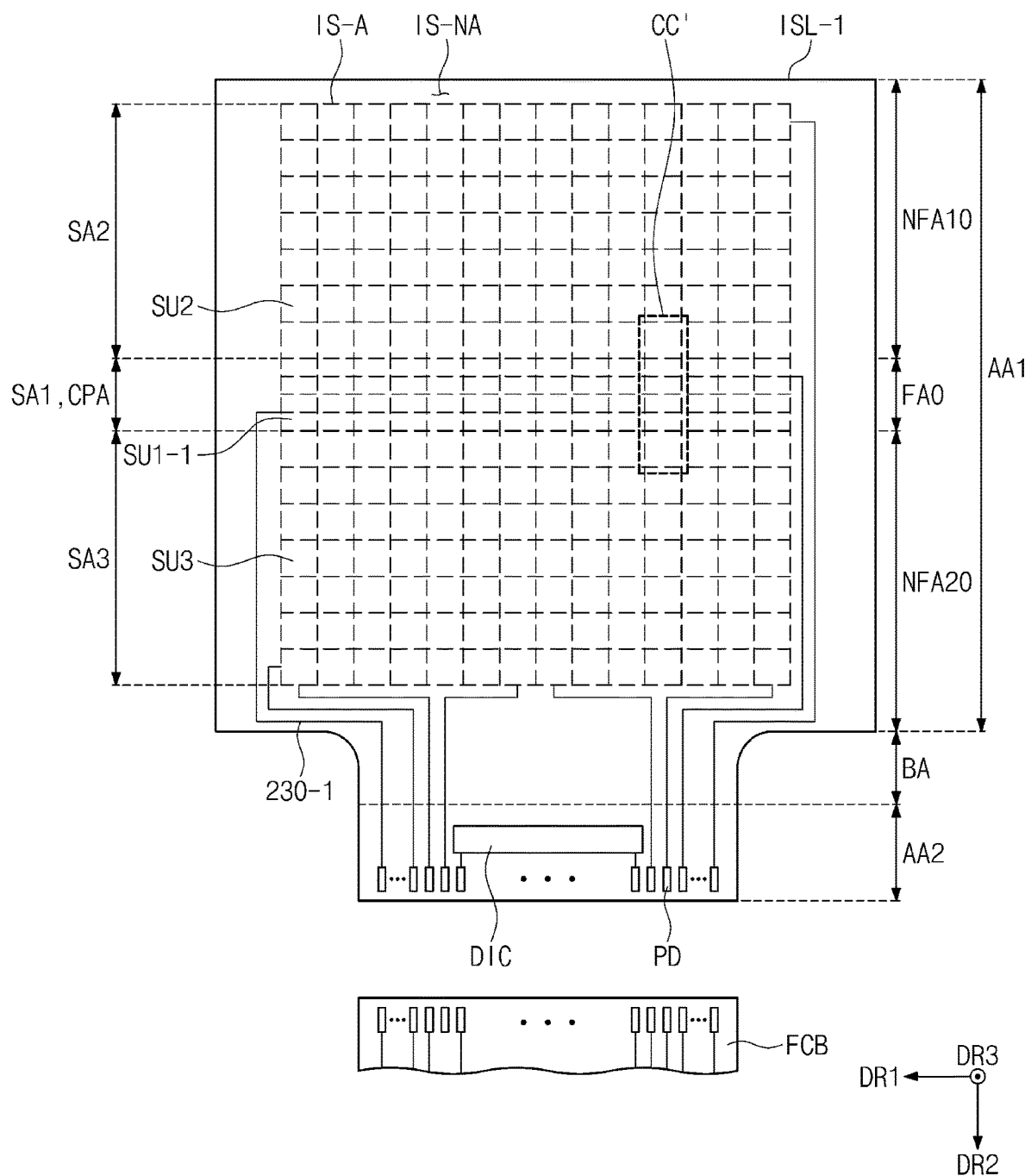
FIG. 13 is a plan view illustrating a sensor layer according to an embodiment of the inventive concept.
Figure 14:
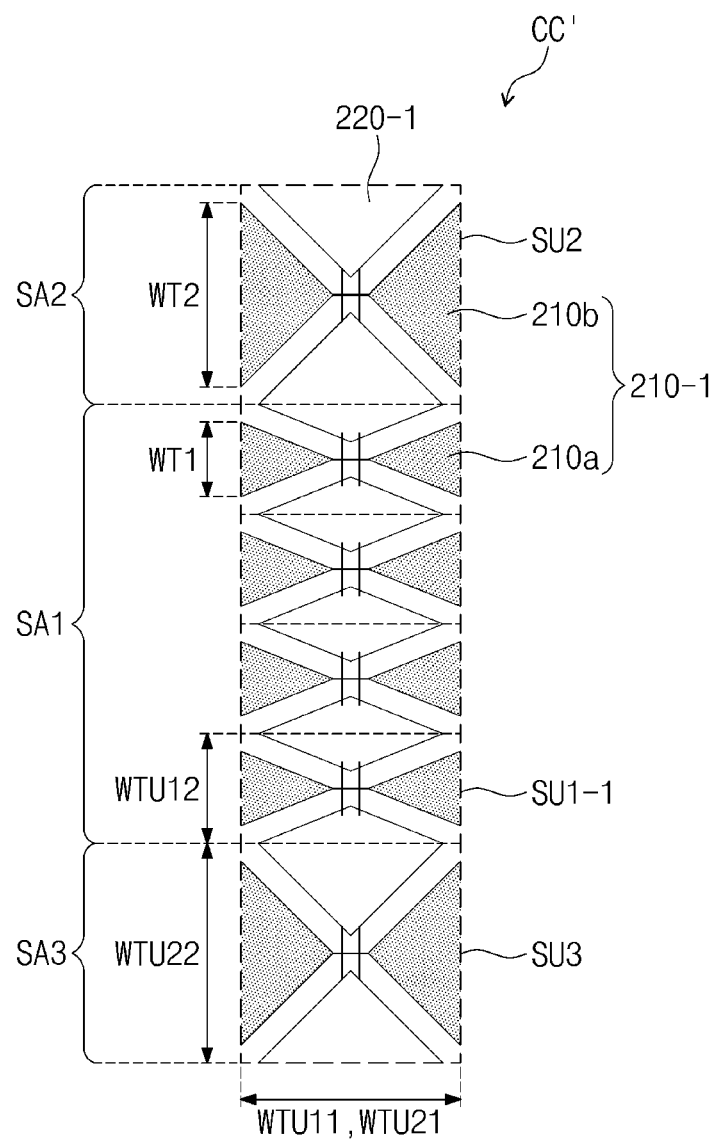
FIG. 14 is an enlarged plan view illustrating an area CC' shown in FIG. 13.

FIG. 13 is a plan view illustrating a sensor layer according to an embodiment of the inventive concept. FIG. 14 is an enlarged plan view of an area CC' shown in FIG. 13. In describing FIGS. 13 and 14, components that are substantially the same as those described in FIGS. 11A, 11B, and 12 are denoted by the same reference numerals, and parts that are different from FIGS. 11A, 11B, and 12 will be mainly described.

Referring to FIGS. 13 and 14, a first detection area SA1, a second detection area SA2, and a third detection area SA3 may be defined in the sensor layer ISL-1. The first to third detection areas SA1, SA2, and SA3 may correspond to the detection area IS-A. The first detection area SA1 may overlap the folding area FA0, the second detection area SA2 may overlap the first non-folding area NFA10, and the third detection area SA3 may overlap the second non-folding area NFA20.

The sensor layer ISL-1 may include electrodes 210-1, cross electrodes 220-1, and detection lines 230-1. Each of the electrodes 210-1 may extend along the first direction DR1, and the electrodes 210-1 may be arranged along the second direction DR2. The cross electrodes 220-1 may be arranged along the first direction DR1, and each of the cross electrodes 220-1 may extend along the second direction DR2.

The electrodes 210-1 may include a first electrode 210a overlapping the folding area FA0 and a second electrode 210b spaced apart from the folding area FA0. The second electrode 210b may overlap the first non-folding area NFA10 or the second non-folding area NFA20. The first width WT1 of the first electrode 210a parallel to the second direction DR2 and the second width WT2 of the second electrode 210b parallel to the second direction DR2 may be different from each other. The first width WT1 may be smaller than the second width WT2. The first width WT1 may be the maximum width parallel to the second direction DR2 of the first electrode 210a, and the second width WT2 may be the maximum width parallel to the second direction DR2 of the second electrode 210b.

The sensor layer ISL-1 may include a first detection unit SU1-1 disposed in the first detection area SA1, a second detection unit SU2 disposed in the second detection area SA2, and a third detection unit SU3 disposed in the third detection area SA3.

Each of the first to third detection units SU1-1, SU2, and SU3 may be defined as an area where any one electrode 210-1 of the electrodes 210-1 and any one cross electrode 220-1 of the cross electrodes 220-1 intersect. Because the first width WT1 of the first electrode 210a is smaller than the second width WT2 of the second electrode 210b, an area of the first detection unit SU1-1 may be smaller than an area of each of the second detection unit SU2 and the third detection unit SU3.

To detect an input by the pen PEN (see FIG. 7), the area (or size) of the first detection unit SU1-1 disposed in the first detection area SA1 or the compensation area CPA may be smaller than the area (or size) of each of the second detection unit SU2 and the third detection unit SU3. As the area of the detection unit decreases, the degree of coincidence between the actual input position of the pen PEN (see FIG. 7) and the sensed coordinates may increase. In addition, as the accuracy of the sensed coordinates is improved, linearity for the input of the pen PEN (see FIG. 7) may be improved.

The folding area FA0 of the display layer DPL (refer to FIG. 4) may be folded based on the folding axis FX (refer to FIG. 1B) extending along the first direction DR1. The width WTU11 of the first detection unit SU1-1 in a direction parallel to the first direction DR1 may be the same as the width WTU21 in a direction parallel to the first direction DR1 of each of the second detection unit SU2 and the third detection unit SU3. The width WTU12 of the first detection unit SU1-1 in a direction parallel to the second direction DR2 may be smaller than the width WTU22 in a direction parallel to the second direction DR2 of each of the second detection unit SU2 and the third detection unit SU3. For example, the width WTU22 of each of the second detection unit SU2 and the third detection unit SU3 may be twice the width WTU12 of the first detection unit SU1-1. For example, the widths WTU21 and WTU22 of the second detection unit SU2 and the third detection unit SU3 and the width WTU11 of the first detection unit SU1-1 may be 4 mm, and the width WTU12 of the first detection unit SU1-1 may be 2 mm.

Figure 15:
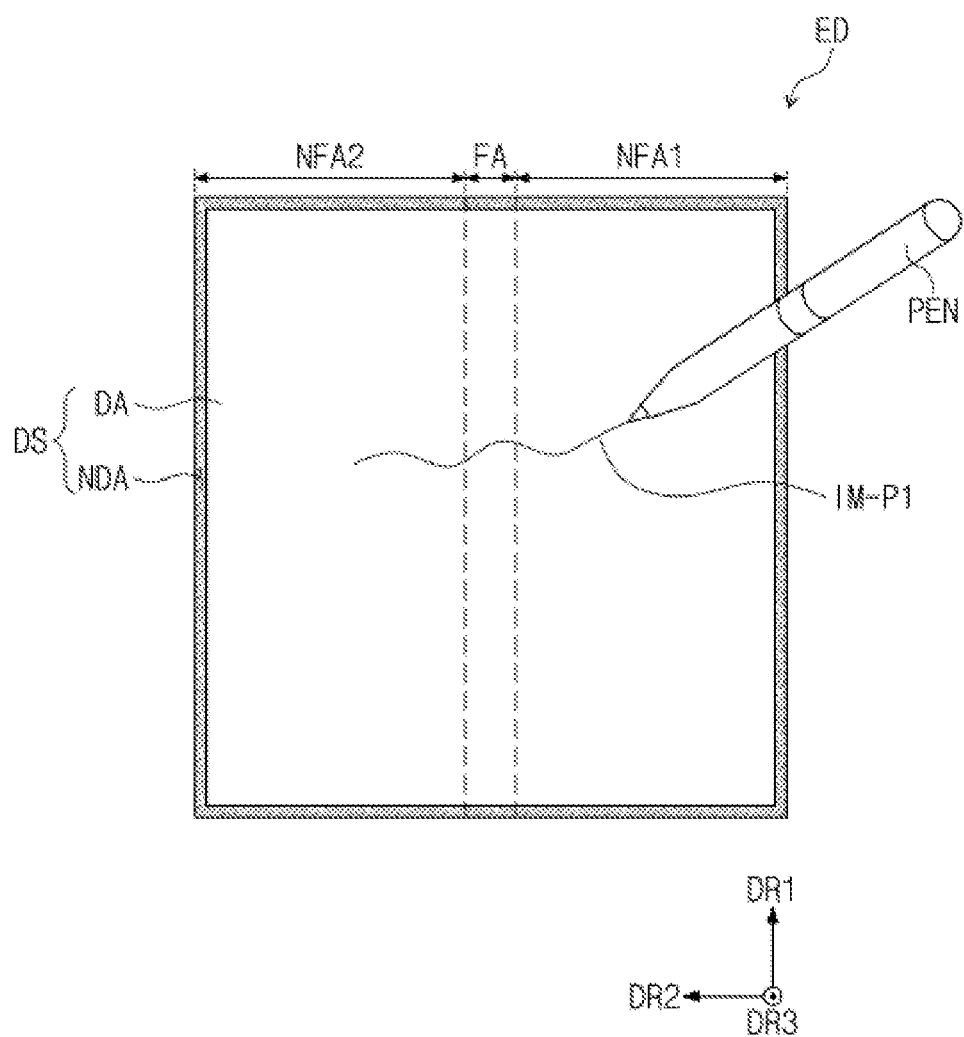
FIG. 15 is a plan view illustrating an electronic device according to an embodiment of the inventive concept.

FIG. 15 is a plan view illustrating an electronic device according to an embodiment of the inventive concept.

Referring to FIGS. 7, 9A, and 15, the input of the pen PEN may be provided while crossing the second non-folding area NFA2, the folding area FA, and the first non-folding area NFA1. The input of the pen PEN provided to the second non-folding area NFA2 is detected by the second detection area DSA2 of the second digitizer DTM-2, and the input of the pen PEN provided to the first non-folding area NFA1 may be detected by the first detection area DSA1 of the first digitizer DTM-1. The input of the pen PEN provided in the folding area FA may be detected by the sensor layer ISL. Specifically, an input of the pen PEN may be detected by the sensor layer ISL in an area non-overlapping with the first detection area DSA1 and the second detection area DSA2.

The main driver EP-C may calculate the coordinates of the pen PEN based on each of the first signal SG1 obtained from the sensor layer ISL, the second signal SG2 obtained from the first digitizer DTM-1, and the third signal SG3 obtained from the second digitizer DTM-2. The main driver EP-C may output a pen image IM-P1 corresponding to an input of the pen PEN to the electronic device ED.

According to an embodiment of the inventive concept, as the first digitizer DTM-1 and the second digitizer DTM-2 are spaced apart from each other in an area overlapping the folding area FA, folding reliability of the electronic device ED may be improved. In addition, by using the sensor layer ISL in combination with the first and second digitizers DTM-1 and DTM-2, the electronic device ED may detect the input of the pen PEN to the area where the input by the pen PEN cannot be detected by the first and second digitizers DTM-1 and DTM-2. Accordingly, because the entire display area DA may be used as an area in which the pen PEN may be inputted, the electronic device ED with improved pen utilization may be provided.

Figure 16:
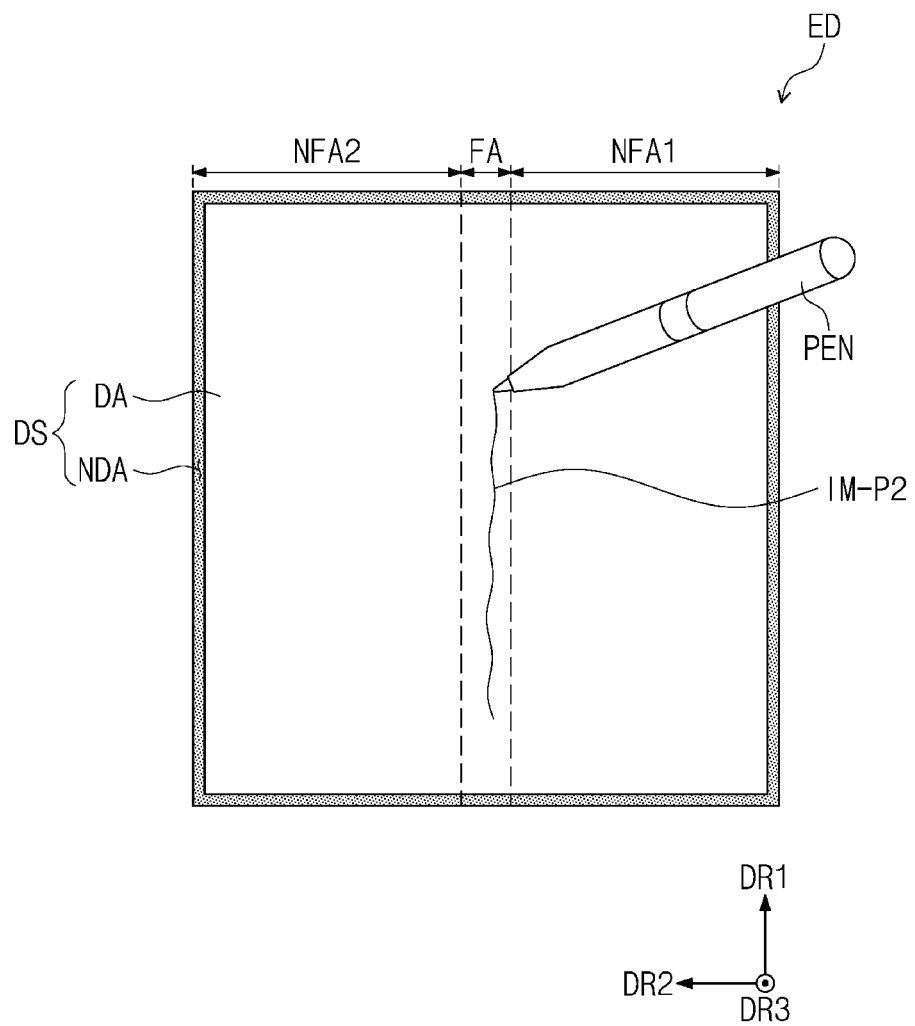
FIG. 16 is a plan view illustrating an electronic device according to an embodiment of the inventive concept.

FIG. 16 is a plan view illustrating an electronic device according to an embodiment of the inventive concept.

Referring to FIGS. 7, 9A, and 16, the input of the pen PEN may be provided to an area non-overlapping with the first detection area DSA1 of the first digitizer DTM-1 and the second detection area DSA2 of the second digitizer DTM-2. For example, the input of the pen PEN may be provided to the folding area FA.

In this case, the input of the pen PEN may be detected by the sensor layer ISL. Accordingly, the main driver EP-C may output a pen image IM-P2 corresponding to an input of the pen PEN to the electronic device ED based on the first signal SG1 obtained from the sensor layer ISL.

According to the above, as the first digitizer and the second digitizer are spaced apart from each other in the area overlapping the folding area of the electronic device, folding reliability of the electronic device may be improved. In addition, the input of the pen may be detected in an area where the input of the pen cannot be detected by the first and second digitizers using the sensor layer. Accordingly, because the entire display area of the electronic device may be used as a pen input area, an electronic device with improved pen utilization may be provided.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic device comprising:
    a display layer configured to define a first non-folding area, a second non-folding area, and a folding area between the first non-folding area and the second non-folding area, and display an image;
    a sensor layer disposed on the display layer to detect an external input;
    a first digitizer disposed under the display layer and overlapping the first non-folding area;
    a second digitizer disposed under the display layer and overlapping the second non-folding area; and
    a main driver configured to calculate coordinates of a pen based on a first signal obtained from the sensor layer, a second signal obtained from the first digitizer, and a third signal obtained from the second digitizer,
    wherein the first signal is obtained in a compensation area of the sensor layer that overlaps a gap between the first digitizer and the second digitizer.

2. The electronic device of claim 1, wherein a first detection area overlapping the folding area, a second detection area overlapping the first non-folding area, and a third detection area overlapping the second non-folding area are defined in the sensor layer,
    wherein the first signal is a signal obtained from the first detection area.

3. The electronic device of claim 2, wherein the sensor layer comprises a first detection unit disposed in the first detection area, a second detection unit disposed in the second detection area, and a third detection unit disposed in the third detection area, and
    wherein areas of the first to third detection units are the same.

4. The electronic device of claim 2, wherein the sensor layer comprises:
    a first detection unit disposed in the first detection area, a second detection unit disposed in the second detection area, and a third detection unit disposed in the third detection area, and
    wherein an area of the first detection unit is smaller than each of an area of the second detection unit and an area of the third detection unit.

5. The electronic device of claim 4, wherein the folding area of the display layer is folded based on a folding axis extending in a first direction,
    wherein a width of the first detection unit in a direction parallel to the first direction is the same as a width of each of the second detection unit and the third detection unit in a direction parallel to the first direction,
    wherein a width of the first detection unit in a direction parallel to a second direction crossing the first direction is smaller than a width of each of the second detection unit and the third detection unit in a direction parallel to the second direction.

6. The electronic device of claim 1, further comprising:
    a sensor driver electrically connected to the sensor layer; and
    a digitizer driver electrically connected to the first digitizer and the second digitizer,
    wherein the main driver calculates the coordinates of the pen based on data provided from the sensor driver and data provided from the digitizer driver.

7. The electronic device of claim 1, wherein the first signal is a signal detected by an input by an object of less than a reference diameter.

8. The electronic device of claim 1, wherein the first digitizer and the second digitizer are spaced apart from each other, and
    wherein a gap between the first digitizer and the second digitizer overlaps the folding area of the display layer.

9. The electronic device of claim 1, wherein a first detection area configured to detect an input of a pen is defined in the first digitizer,
    wherein a second detection area configured to detect the input of the pen is defined in the second digitizer,
    wherein the compensation area configured to sense the input of the pen is defined in the sensor layer, and
    wherein at least a portion of the compensation area non-overlaps each of the first detection area and the second detection area.

10. The electronic device of claim 1, wherein the sensor layer comprises:
    a first detection unit disposed in the compensation area, and a second detection unit disposed in a peripheral area of the compensation area, and
    wherein an area of the first detection unit is smaller than an area of the second detection unit.

11. The electronic device of claim 1, wherein the sensor layer comprises:
    an electrode and a cross electrode crossing the electrode,
    wherein the sensor layer obtains information on an external input through a change in capacitance between the electrode and the cross electrode, and
    wherein each of the first digitizer and the second digitizer includes a plurality of coils, and obtains the information on the external input through a signal induced to the plurality of coils.

12. An electronic device comprising:
    a display layer configured to define a first non-folding area, a second non-folding area, and a folding area between the first non-folding area and the second non-folding area, and display an image;
    a sensor layer disposed on the display layer to detect an external input and including a plurality of electrodes extending along a first direction and a plurality of cross electrodes extending along a second direction crossing the first direction;

a first digitizer disposed under the display layer and overlapping the first non-folding area; and a second digitizer disposed under the display layer and overlapping the second non-folding area, a main driver configured to calculate coordinates of a pen based on a first signal obtained from the sensor layer, a second signal obtained from the first digitizer, and a third signal obtained from the second digitizer, wherein the first signal is obtained in a compensation area of the sensor layer that overlaps a gap between the first digitizer and the second digitizer, wherein the folding area is folded based on a folding axis extending along the first direction, wherein a first width of a first electrode overlapping the folding area among the plurality of electrodes is smaller than a second width of a second electrode spaced apart from the folding area among the plurality of electrodes, and wherein the first width is a maximum width parallel to the second direction of the first electrode, and the second width is a maximum width parallel to the second direction of the second electrode.

13. The electronic device of claim 12,
wherein the first signal is a signal detected by an input by an object of less than a reference diameter.

14. The electronic device of claim 12, wherein the sensor layer comprises:
a first detection unit overlapping the folding area, a second detection unit overlapping the first non-folding area, and a third detection unit overlapping the second non-folding area, and
wherein an area of the first detection unit is smaller than each of areas of the second detection unit and the third detection unit.

15. The electronic device of claim 14, wherein each of the first detection unit, the second detection unit, and the third detection unit is defined as an area where any one of the plurality of electrodes and any one of the plurality of cross electrodes cross each other.

16. The electronic device of claim 12, wherein a first detection area configured to detect an input of a pen is defined in the first digitizer, wherein a second detection area configured to detect an input of the pen is defined in the second digitizer, wherein the first electrode non-overlaps the first detection area and the second detection area, and wherein the second electrode overlaps the first detection area or the second detection area.

17. The electronic device of claim 12, wherein the first digitizer and the second digitizer are spaced apart from each other, and wherein a gap between the first digitizer and the second digitizer overlaps the folding area of the display layer.

18. An electronic device driving method comprising:
receiving a first signal from a sensor layer in which a first non-folding area, a second non-folding area, and a folding area between the first and second non-folding areas are defined;
receiving a second signal and a third signal from a first digitizer overlapping the first non-folding area and a second digitizer overlapping the second non-folding area, respectively, the first and second digitizers being disposed under the sensor layer; and
calculating coordinates for a pen input using the first signal, the second signal, and the third signal,
wherein the first signal is obtained in a compensation area of the sensor layer that overlaps a gap between the first digitizer and the second digitizer.

19. The method of claim 18, wherein the first signal is a signal detected by an input by an object of less than a reference diameter.

20. The method of claim 19, wherein the calculating of the coordinates for the pen input comprises:
calculating coordinates of the pen inputted to the first non-folding area based on the second signal provided from a first detection area of the first digitizer;
calculating coordinates of the pen inputted to the second non-folding area based on the third signal provided from a second detection area of the second digitizer; and
calculating coordinates of the pen inputted to the folding area based on the first signal provided from the compensation area of the sensor layer non-overlapping the first detection area and the second detection area.

* * * * *